United States Patent
Shirota et al.

(10) Patent No.: US 8,357,311 B2
(45) Date of Patent: Jan. 22, 2013

(54) POLISHING LIQUID COMPOSITION

(75) Inventors: Mami Shirota, Wakayama (JP);
Yasuhiro Yoneda, Wakayama (JP)

(73) Assignee: Kao Corporation, Tokyo (JP)

( * ) Notice: Subject to any disclaimer, the term of this patent is extended or adjusted under 35 U.S.C. 154(b) by 629 days.

(21) Appl. No.: 12/520,747

(22) PCT Filed: Dec. 28, 2007

(86) PCT No.: PCT/JP2007/075309
§ 371 (c)(1),
(2), (4) Date: Jun. 22, 2009

(87) PCT Pub. No.: WO2008/081943
PCT Pub. Date: Jul. 10, 2008

(65) Prior Publication Data
US 2010/0056026 A1      Mar. 4, 2010

(30) Foreign Application Priority Data

Dec. 28, 2006 (JP) ................. 2006-356517
Apr. 5, 2007 (JP) ................. 2007-099866
Apr. 23, 2007 (JP) ................. 2007-113445
May 25, 2007 (JP) ................. 2007-139661
May 29, 2007 (JP) ................. 2007-141356
Dec. 14, 2007 (JP) ................. 2007-324025

(51) Int. Cl.
*C09K 13/00* (2006.01)
*C09K 3/14* (2006.01)
(52) U.S. Cl. ........ 252/79.1; 51/309
(58) Field of Classification Search ............ None
See application file for complete search history.

(56) References Cited

U.S. PATENT DOCUMENTS

| 5,693,299 | A | 12/1997 | Chopin et al. |
| 5,958,827 | A | 9/1999 | Suda et al. |
| 6,214,306 | B1 | 4/2001 | Aubert et al. |
| 2005/0176580 | A1* | 8/2005 | Osaka et al. ......... 502/339 |

(Continued)

FOREIGN PATENT DOCUMENTS

EP        1 378 489 A1    1/2004

(Continued)

OTHER PUBLICATIONS

European Search Report mailed on May 30, 2011 for European Application No. 07860512.8.

(Continued)

*Primary Examiner* — Shamim Ahmed
*Assistant Examiner* — Bradford Gates
(74) *Attorney, Agent, or Firm* — Birch, Stewart, Kolasch & Birch, LLP

(57) ABSTRACT

A polishing liquid composition includes composite oxide particles containing cerium and zirconium, a dispersing agent, and an aqueous medium. A powder X-ray diffraction spectrum of the composite oxide particles obtained by CuKα1 ray (λ=0.154050 nm) irradiation includes a peak (first peak) having a peak top in a diffraction angle 2θ (θ is a Bragg angle) range of 28.61 to 29.67°, a peak (second peak) having a peak top in a diffraction angle 2θ range of 33.14 to 34.53°, a peak (third peak) having a peak top in a diffraction angle 2θ range of 47.57 to 49.63°, and a peak (fourth peak) having a peak top in a diffraction angle 2θ range of 56.45 to 58.91°. A half-width of the first peak is 0.8° or less.

11 Claims, 6 Drawing Sheets

U.S. PATENT DOCUMENTS

| | | |
|---|---|---|
| 2006/0042949 A1* | 3/2006 | McCollum et al. ............ 204/471 |
| 2006/0083694 A1* | 4/2006 | Kodas et al. ..................... 424/46 |
| 2006/0113283 A1 | 6/2006 | Yoneda et al. |
| 2007/0264486 A1* | 11/2007 | Verdier ...................... 428/315.5 |
| 2008/0064211 A1 | 3/2008 | Tsugita et al. |

FOREIGN PATENT DOCUMENTS

| | | |
|---|---|---|
| EP | 1 542 266 A1 | 6/2005 |
| EP | 1 707 534 A1 | 10/2006 |
| JP | 6-226094 A | 8/1994 |
| JP | 9-221304 A | 8/1997 |
| JP | 10-237425 A | 9/1998 |
| JP | 10-512191 A | 11/1998 |
| JP | 2001-348563 A | 12/2001 |
| JP | 2001-348564 A | 12/2001 |
| JP | 2001-351882 A | 12/2001 |
| JP | 2001-351883 A | 12/2001 |
| JP | 2002-97459 A | 4/2002 |
| JP | 2003-055648 A | 2/2003 |
| JP | 2005-158867 A | 6/2005 |
| JP | 3782771 B2 | 3/2006 |
| JP | 2006-156825 A | 6/2006 |
| JP | 2006-173411 A | 6/2006 |
| WO | WO 2006030120 A1 * | 3/2006 |
| WO | WO 2006/120727 A1 | 11/2006 |

OTHER PUBLICATIONS

Chinese Office Action for Chinese Application No. 200780047959.9 dated Jan. 31, 2012.

Japanese Office Action dated Aug. 7, 2012 for Japanese Patent Application No. 2007-331135, with English translation.

* cited by examiner

US 8,357,311 B2

POLISHING LIQUID COMPOSITION

TECHNICAL FIELD

The present invention relates to a polishing liquid composition used, e.g., in chemical-mechanical polishing (CMP) performed in the manufacturing process or the like of a semiconductor device or a polishing treatment performed in the manufacturing process or the like of a precision glass product, a product associated with a display etc. Moreover, the present invention relates to a polishing method using the polishing liquid composition, a method for manufacturing a glass substrate, and a method for manufacturing a semiconductor device.

BACKGROUND ART

For example, composite oxide particles containing cerium and zirconium have been used to polish an oxide film (e.g., a silicon oxide film) constituting a semiconductor device, base materials of the following glass substrates: a base material of a chemically tempered glass substrate such as an aluminosilicate glass substrate; a base material of a crystallized glass substrate such as a glass-ceramic substrate; and a base material of a synthetic quartz glass substrate used as a photomask substrate, or a glass surface or the like of a liquid crystal display panel (see, e.g., Patent Documents 1 and 2).

In order to solve the problems of scratches and dust that arise when polishing is performed with a polishing liquid composition including cerium oxide particles as an abrasive, the polishing liquid composition described in Patent Document 1 includes composite oxide particles in which the secondary particles have an average particle size of 5 μm or less, instead of the cerium oxide particles as an abrasive. The materials of the composite oxide particles include a cerium compound (e.g., $CeCl_3$) and a zirconia compound (e.g., $ZrOCl_2$). The oxidation number of cerium in the cerium compound is 3, and the oxidation number of zirconia in the zirconia compound is 4. The composite oxide particles may be prepared in the following manner.

A cerium compound, a zirconium compound, and ammonia are allowed to react in an aqueous solution to form a water-insoluble compound containing cerium and zirconium. Next, the water-insoluble compound is subjected to oxidation, filtration, and centrifugal separation, so that a coprecipitate is obtained. This coprecipitate is cleaned repeatedly with ultrapure water etc., dried, and then heat-treated in an oven at an atmospheric temperature of 300° C. or more, thereby providing the composite oxide particles.

On the other hand, the polishing liquid composition described in Patent Document 2 includes composite oxide particles that are produced without a calcining process. Patent Document 2 discloses that this polishing liquid composition can form a surface with high surface accuracy, increase the polishing rate despite a small particle size of the composite oxide particles, and suppress damage such as scratches. The materials of the composite oxide particles include a cerium compound and a zirconium compound. The oxidation number of cerium in the cerium compound is 3 or 4, and the oxidation number of zirconium in the zirconium compound is 4.

Patent Document 1: JP 2001-348563 A

Patent Document 2: Japanese Patent Number 3782771

DISCLOSURE OF INVENTION

Problem to be Solved by the Invention

However, polishing with the above polishing liquid compositions can neither ensure a sufficient polishing rate nor reduce scratches.

The present invention provides a polishing liquid composition capable of polishing an object to be polished at a higher speed, a polishing method using this polishing liquid composition, a method for manufacturing a glass substrate, and a method for manufacturing a semiconductor device.

Means for Solving Problem

A polishing liquid composition of the present invention includes composite oxide particles containing cerium and zirconium, a dispersing agent, and an aqueous medium. A powder X-ray diffraction spectrum of the composite oxide particles obtained by CuKα1 ray ($\lambda=0.154050$ nm) irradiation includes a peak (first peak) having a peak top in a diffraction angle $2\theta$ ($\theta$ is a Bragg angle) range of 28.61 to 29.67°, a peak (second peak) having a peak top in a diffraction angle $2\theta$ range of 33.14 to 34.53°, a peak (third peak) having a peak top in a diffraction angle $2\theta$ range of 47.57 to 49.63°, and a peak (fourth peak) having a peak top in a diffraction angle $2\theta$ range of 56.45 to 58.91°. A half-width of the first peak is 0.80 or less. When there is at least one peak of a peak $a_1$ derived from a cerium oxide and a peak $a_2$ derived from a zirconium oxide in the powder X-ray diffraction spectrum, both heights of peak tops of the peaks $a_1$, $a_2$ are 6.0% or less of a height of the peak top of the first peak, where the peak top of the peak $a_1$ lies in a diffraction angle $2\theta$ range of 28.40 to 28.59° and the peak top of the peak $a_2$ lies in a diffraction angle $2\theta$ range of 29.69 to 31.60°.

A polishing liquid composition of the present invention includes composite oxide particles containing cerium and zirconium, a dispersing agent, and an aqueous medium. The composite oxide particles are obtained by mixing a precipitant and a solution that includes a cerium compound with an oxidation number of 4 and a zirconium compound with an oxidation number of 4, hydrolyzing the cerium compound and the zirconium compound, separating and subsequently calcining the resultant precipitate, and pulverizing the calcined product.

A polishing method of the present invention includes supplying the polishing liquid composition of the present invention between an object to be polished and a polishing pad, and polishing the object to be polished by moving the polishing pad relative to the object to be polished while the object to be polished is in contact with the polishing pad.

A method for manufacturing a glass substrate of the present invention includes polishing at least one of two principal surfaces of a base material of a glass substrate with the polishing liquid composition of the present invention.

A method for manufacturing a semiconductor device of the present invention includes a thin film formation process of forming a thin film on one principal surface side of a semiconductor substrate and a polishing process of polishing the thin film with the polishing liquid composition of the present invention.

BEST MODE FOR CARRYING OUT THE INVENTION

Embodiment 1

Figure 1A:
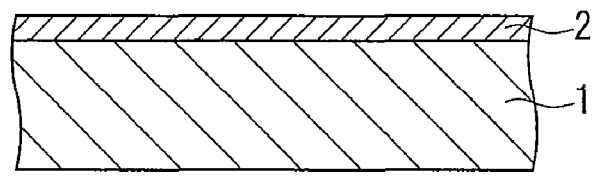
FIG. 1A is a cross-sectional view showing an example of a step in a manufacturing method of a semiconductor device of the present invention or in a polishing method of the present invention.

In Embodiment 1, an example of a polishing liquid composition of the present invention will be described.

Composite oxide particles constituting the polishing liquid composition of Embodiment 1 can be expressed, e.g., by the following composition formula.

$Ce_xZr_{1-x}O_2$ where x is a number satisfying $0<x<1$, preferably $0.50<x<0.97$, more preferably $0.55<x<0.95$, even more preferably $0.60<x<0.93$, much more preferably $0.65<x<0.90$, and further preferably $0.70<x<0.90$.

In each of the composite oxide particles, a cerium oxide and a zirconium oxide are uniformly melted together to form a solid phase. The analysis of these composite oxide particles by the X-ray (Cu—Kα1 ray, λ=0.154050 nm) diffraction method can provide a spectrum in which the following peaks are observed.

In the spectrum, at least a peak (first peak) having a peak top in a diffraction angle 2θ range of 28.61 to 29.67°, a peak (second peak) having a peak top in a diffraction angle 2θ range of 33.14 to 34.53°, a peak (third peak) having a peak top in a diffraction angle 2θ range of 47.57 to 49.63°, and a peak (fourth peak) having a peak top in a diffraction angle 2θ range of 56.45 to 58.91° are observed.

From the viewpoint of improving the polishing rate, it is preferable that the spectrum of the composite oxide particles includes at least a peak (first peak) having a peak top in a diffraction angle 2θ range of 28.61 to 29.39°, a peak (second peak) having a peak top in a diffraction angle 2θ range of 33.14 to 34.16°, a peak (third peak) having a peak top in a diffraction angle 2θ range of 47.57 to 49.08°, and a peak (fourth peak) having a peak top in a diffraction angle 2θ range of 56.45 to 58.25°. It is more preferable that the spectrum of the composite oxide particles includes at least a peak (first peak) having a peak top in a diffraction angle 2θ range of 28.61 to 29.25°, a peak (second peak) having a peak top in a diffraction angle 2θ range of 33.14 to 34.04°, a peak (third peak) having a peak top in a diffraction angle 2θ range of 47.57 to 48.90°, and a peak (fourth peak) having a peak top in a diffraction angle 2θ range of 56.45 to 58.02°. It is even more preferable that the spectrum of the composite oxide particles includes at least a peak (first peak) having a peak top in a diffraction angle 2θ range of 28.68 to 29.11°, a peak (second peak) having a peak top in a diffraction angle 2θ range of 33.23 to 33.79°, a peak (third peak) having a peak top in a diffraction angle 2θ range of 47.71 to 48.53°, and a peak (fourth peak) having a peak top in a diffraction angle 2θ range of 56.61 to 57.60°.

It is preferable that a second peak area is 10 to 50% of a first peak area, a third peak area is 35 to 75% of the first peak area, and a fourth peak area is 20 to 65% of the first peak area. From the viewpoint of improving the polishing rate, it is more preferable that the second peak area is 15 to 45% of the first peak area, the third peak area is 40 to 70% of the first peak area, and the fourth peak area is 25 to 60% of the first peak area. It is even more preferable that the second peak area is 20 to 40% of the first peak area, the third peak area is 45 to 65% of the first peak area, and the fourth peak area is 30 to 55% of the first peak area.

In the spectrum, there may be at least one peak of a peak $a_1$ derived from the cerium oxide and a peak $a_2$ derived from the zirconium oxide. In this case, from the viewpoint of reducing scratches, both heights of the peak tops of the peaks $a_1$, $a_2$ are 6.0% or less, preferably 3.0% or less, more preferably 1.0% or less, and even more preferably 0% of the height of the peak top of the first peak.

The peak top of the peak $a_1$ lies in a diffraction angle 2θ range of 28.40 to 28.59°, and the peak top of the peak $a_2$ lies in a diffraction angle 2θ range of 29.69 to 31.60°. In the present specification, these values of the diffraction angle 2θ range are based on the values of the cerium oxide and the zirconium oxide obtained from the ICDD (international center for diffraction data). Specifically, the diffraction angle 2θ range of 28.40 to 28.59° including the peak top of the peak $a_1$ relates to a cubic cerium oxide. The diffraction angle 2θ range of 29.69 to 31.60° including the peak top of the peak $a_2$ is based on 2θ (29.69°) of a tetragonal zirconium oxide and 2θ (31.60°) of a monoclinic zirconium oxide.

The half-width of the first peak is 0.8° or less, but preferably 0.7° or less, more preferably 0.6° or less, even more preferably 0.5° or less, and much more preferably 0.45° or less from the viewpoint of improving the polishing rate. As expressed by the Scherrer equation, this half-width correlates with the crystallite size. The half-width becomes smaller with an increase in the crystalline size due to crystal growth.

In the composite oxide particles included in the polishing liquid composition of this embodiment, the cerium oxide derives from a cerium compound with an oxidation number of 4 and the zirconium oxide derives from a zirconium compound with an oxidation number of 4, as will be described later. For this reason, the cerium oxide and the zirconium oxide are uniformly melted together to form a solid phase, and thus the above X-ray diffraction spectrum may be observed. When the cerium oxide of the composite oxide particles derives from a cerium compound with an oxidation number of 3, as in the case of the composite oxide particles included in the polishing liquid composition of Patent Document 1, a solid phase such that the cerium oxide and the zirconium oxide are uniformly melted together cannot be formed sufficiently. Consequently, at least one peak of the peak $a_1$ derived from the cerium oxide and the peak $a_2$ derived from the zirconium oxide is observed.

The X-ray diffraction spectrum of the composite oxide particles included in the polishing liquid composition of this embodiment shows that the half-width of the first peak is small and the first peak is very sharp. This is because the crystallite size of the solid phase may be increased, namely the crystallinity may be improved by sufficient calcination of the composite oxide particles during the manufacturing process, as will be described later. In contrast, since the composite oxide particles included in the polishing liquid composition of Patent Document 2 are not calcined sufficiently during the manufacturing process, the crystallinity of the solid phase is not satisfactory. Thus, the X-ray diffraction spectrum shows that the half-width of the first peak is large and the first peak is broad.

As described above, the polishing liquid composition of this embodiment includes the composite oxide particles having a solid phase with high crystallinity, in which the cerium oxide and the zirconium oxide are uniformly melted together. Therefore, the polishing liquid composition of this embodiment is capable of polishing the object to be polished at a higher speed than the conventional polishing liquid composition.

From the viewpoint of improving the polishing rate, the molar ratio (Ce/Zr) of atoms in the composite oxide particles is preferably (99/1) to (5/95), more preferably (97/3) to (16/84), even more preferably (95/5) to (40/60), much more preferably (94/6) to (50/50), and further preferably (93/7) to (60/40).

From the viewpoint of reducing scratches, the atomic ratio x of Ce to Zr in the composite oxide ($Ce_xZr_{1-x}O_2$) particles is preferably 0.60 to 0.93, more preferably 0.65 to 0.90, and even more preferably 0.70 to 0.90.

From the viewpoint of improving the polishing rate, the volume median diameter (D50) of the composite oxide particles is preferably 30 nm or more, more preferably 40 nm or more, and even more preferably 50 nm or more. From the viewpoint of improving the dispersion stability of the composite oxide particles in the polishing liquid composition, D50 is preferably 1000 nm or less, more preferably 500 nm or less, and even more preferably 250 nm or less. Accordingly, the volume median diameter (D50) of the composite oxide particles is preferably 30 to 1000 nm, more preferably 40 to 500 nm, and even more preferably 50 to 250 nm.

In the present specification, the volume median diameter (D50) indicates a particle size at which the cumulative volume frequency calculated based on the volume fraction of the particles from a smaller particle size side reaches 50%. The volume median diameter (D50) is obtained as a median diameter on the volume basis measured with a laser diffraction/scattering particle size distribution analyzer (LA-920 manufactured by HORIBA Ltd.).

From the viewpoint of improving the polishing rate, the average primary particle size of the composite oxide particles is preferably 10 nm or more, more preferably 20 nm or more, and even more preferably 30 nm or more. From the viewpoint of improving the specular state of the polished surface as a result of polishing the object to be polished, the average primary particle size of the composite oxide particles is preferably 200 nm or less, more preferably 150 nm or less, and even more preferably 100 nm or less. Accordingly, the average primary particle size of the composite oxide particles is preferably 10 to 200 nm, more preferably 20 to 150 nm, and even more preferably 30 to 100 nm.

In the present specification, the average primary particle size (nm) indicates a particle size (converted to spherical diameter) determined by the following equation using a specific surface area S ($m^2/g$) that is calculated with a BET (nitrogen adsorption) method.

$$\text{Average primary particle size(nm)} = 820/S$$

From the viewpoint of improving the polishing rate, the content of the composite oxide particles in the polishing liquid composition is preferably 0.1 wt % or more, more preferably 0.2 wt % or more, even more preferably 0.4 wt % or more, and much more preferably 0.5 wt % or more. From the viewpoint of improving the dispersion stability and reducing the cost, the content of the composite oxide particles is preferably 8 wt % or less, more preferably 5 wt % or less, even more preferably 4 wt % or less, and much more preferably 3 wt % or less. Accordingly, the content of the composite oxide particles is preferably 0.1 to 8 wt %, more preferably 0.2 to 5 wt %, even more preferably 0.4 to 4 wt %, and much more preferably 0.5 to 3 wt %.

The composite oxide particles may be either a commercially available product or an in-house product. Next, an example of a method for producing the composite oxide particles will be described.

The composite oxide particles can be produced by mixing a precipitant and a solution that includes the cerium compound with an oxidation number of 4 (also referred to as a cerium (IV) compound in the following) and the zirconium compound with an oxidation number of 4 (also referred to as a zirconium (IV) compound in the following), hydrolyzing the cerium (IV) compound and the zirconium (IV) compound, separating and subsequently calcining the resultant precipitate, and pulverizing the calcined product.

The solution including the cerium (IV) compound and the zirconium (IV) compound may be prepared, e.g., by dissolving a water-soluble cerium (IV) compound such as cerium nitrate and a water-soluble zirconium (IV) compound such as zirconium nitrate in solvents such as water individually, and mixing these two solutions.

When a precipitant (basic solution) is added to the solution including the cerium (IV) compound and the zirconium (IV) compound, the cerium (IV) compound and the zirconium (IV) compound are hydrolyzed, and a precipitate is generated. It is preferable that the precipitant is added while stirring the solution including the cerium (IV) compound and the zirconium (IV) compound. Examples of the precipitant include an ammonia solution, an alkali hydroxide solution such as a sodium hydroxide solution or a potassium hydroxide solution, a carbonate solution of sodium, potassium, or ammonia, and a bicarbonate solution. In particular, the precipitant is preferably an aqueous solution of ammonia, sodium hydroxide, or potassium hydroxide, and more preferably an ammonia aqueous solution. The normality of the precipitant is preferably about 1 to 5N, and more preferably about 2 to 3N.

From the view point of providing the composite oxide particles in which the cerium oxide and the zirconium oxide are highly incorporated to form a solid solution, the pH of a supernatant fluid obtained by adding the precipitant to the solution including the cerium (IV) compound and the zirconium (IV) compound is preferably 7 to 11, and more preferably 7.5 to 9.5.

The mixing time of the solution including the cerium (IV) compound and the zirconium (IV) compound with the precipitant is not particularly limited, but is preferably 15 minutes or more, and more preferably 30 minutes or more. The reaction between the solution including the cerium (IV) compound and the zirconium (IV) compound and the precipitant can be performed at any appropriate temperature such as room temperature. The precipitate generated by mixing the solution including the cerium (IV) compound and the zirconium (IV) compound with the precipitant can be separated from the mother liquor by decantation, drying, filtration, and/or a general solid-liquid separation technique such as centrifugal separation. The resultant precipitate is then cleaned with water or the like.

A desirable state of the cerium (IV) compound in the solution is that the cerium (IV) compound is merely added to the aqueous medium. However, the cerium compound containing cerium with an oxidation number of 3 may be electrolytically oxidized in the aqueous medium so that the trivalent cerium is changed to tetravalent cerium. The cerium (IV) compound is included preferably in an amount of 85 wt % or more, more preferably 87 wt % or more, even more preferably 90 wt % or more, and much more preferably 95 wt % or more of the total amount of the cerium compound.

Specifically, the cerium (IV) compound may be water-soluble salts such as cerium (IV) sulfate, cerium (IV) tetraammonium sulfate, and cerium (IV) diammonium nitrate. The reason for using the salt of cerium with an oxidation number of 4 is that it can be hydrolyzed easily compared to the salt of cerium with an oxidation number of 3 and also is suitable for simultaneous hydrolysis with the zirconium (IV) compound (e.g., a salt of zirconium with an oxidation number of 4) in view of the hydrolysis rate.

The zirconium (IV) compound in the solution may be water-soluble zirconium (IV) salts such as zirconium oxychloride (zirconyl chloride), zirconium oxysulfate (zirconyl sulfate), zirconium oxyacetate (zirconyl acetate), zirconium oxynitrate (zirconyl nitrate), zirconium chloride, zirconium nitrate, zirconium acetate, and zirconium sulfate.

As described above, when both the cerium and the zirconium in the solution have an oxidation number of 4, and the pH of the solution is raised by the addition of a basic solution (precipitant), the cerium (IV) compound and the zirconium (IV) compound are hydrolyzed substantially in the same pH range, and cerium hydroxide and zirconium hydroxide precipitate substantially at the same time, resulting in a precipitate in which the cerium hydroxide and the zirconium hydroxide are highly mixed with each other. This precipitate is heat-treated, and then a cerium oxide and a zirconium oxide are uniformly melted together to form a solid phase in part of the precipitate. If the oxidation number of cerium is 3, the cerium (III) compound and the zirconium (IV) compound are hydrolyzed to cause the precipitation of their hydroxides in different pH ranges. Therefore, a precipitate in which the cerium hydroxide and the zirconium hydroxide are not sufficiently mixed is generated. Consequently, when this precipitate is heat-treated, a cerium oxide or a zirconium oxide is generated in part of the precipitate.

When the total amount of the cerium element and the zirconium element in the solution including the cerium (IV) compound and the zirconium (IV) compound is 100 wt % in terms of oxide, the amount of the cerium element is preferably 7 to 99 wt %, more preferably 20 to 98 wt %, and even more preferably 50 to 96 wt % in terms of oxide. The amount of zirconium element is preferably 1 to 93 wt %, more preferably 2 to 80 wt %, and even more preferably 4 to 50 wt % in terms of oxide.

From the viewpoint of improving the crystallinity of the solid phase in which the cerium oxide and the zirconium oxide are uniformly melted together and ensuring a good polishing rate, the calcination temperature of the precipitate is preferably 900 to 1500° C., more preferably 1000 to 1400° C., and even more preferably 1100 to 1300° C. Usually, the heating time is preferably 1 to 10 hours, more preferably 2 to 8 hours, and even more preferably 3 to 7 hours. The calcination can be performed, e.g., using a heating means such as a continuous kiln. The calcination temperature indicates a temperature of the particle surface and is equal to the atmospheric temperature inside the continuous kiln.

A means for pulverizing the calcined product is not particularly limited and may be a grinding apparatus such as a ball mill, a bead mill, or an oscillating mill. The conditions of the pulverizing means may be set appropriately so as to form particles that fall in the desired range of average particle sizes or volume median diameter. The grinding media may be a zirconia ball or the like.

The aqueous medium included in the polishing liquid composition of this embodiment may be water, a mixed medium of water and a solvent, or the like. The preferred solvent may be a solvent that can be mixed with water (e.g., alcohol such as ethanol). In particular, the aqueous medium is preferably water, and more preferably ion-exchanged water.

The dispersing agent included in the polishing liquid composition of this embodiment is preferably soluble in water. It is preferable that the water-soluble dispersing agent is at least one selected from the group consisting of a cationic surface-active agent, an anionic surface-active agent, a nonionic surface-active agent, and an acrylic acid-based polymer. It is more preferable that the dispersing agent is at least one selected from the group consisting of an anionic surface-active agent, a nonionic surface-active agent, and an acrylic acid-based polymer. It is even more preferable that the dispersing agent is an acrylic acid-based polymer. The dispersing agent may be either adsorbed physically by the surfaces of the composite oxide particles or bonded chemically to the surfaces of the composite oxide particles before it is mixed with the aqueous medium.

Examples of the cationic surface-active agent include an aliphatic amine salt and an aliphatic ammonium salt.

Examples of the anionic surface-active agent include a fatty acid soap, carboxylate such as alkyl ether carboxylate, sulfonate such as alkyl benzene sulfonate or alkyl naphthalene sulfonate, sulfate such as fatty alcohol sulfate or alkyl ether sulfate, and phosphate such as alkyl phosphate.

Examples of the nonionic surface-active agent include an ether type such as polyoxyethylene alkyl ether, an ether-ester type such as polyoxyethylene ether of glycerin ester, and an ester type such as polyethylene glycol fatty acid ester, glycerin ester, or sorbitan ester.

The acrylic acid-based polymer may be either a homopolymer or a copolymer. The preferred homopolymer may be a homopolymer having a constitutional unit (A) derived from a monomer (a) such as acrylic acid, a non-metallic salt of acrylic acid, or acrylic ester. The preferred copolymer may be a copolymer having a constitutional unit (A) derived from at least one monomer (a) selected from the group consisting of acrylic acid, a non-metallic salt of acrylic acid, and acrylic ester and a constitutional unit (B) derived from the following monomer (b) or a copolymer having constitutional units (A), each of which is derived from at least two monomers (a) selected from the group consisting of acrylic acid, a non-metallic salt of acrylic acid, and acrylic ester.

The non-metallic salt of acrylic acid may be, e.g., an acrylic acid ammonium salt or an acrylic acid amine salt. The acrylic acid-based polymer may include one or more constitutional units derived from these non-metallic salts of acrylic acid.

When the acrylic acid-based polymer is a copolymer, the constitutional unit (A) included in the copolymer is more than 50 mol % of the total constitutional unit, but preferably more than 70 mol %, more preferably more than 80 mol %, and even more preferably more than 90 mol %.

The monomer (b) has a carboxylic acid (carboxylate) group and contains a polymerizable double bond Examples of the monomer (b) include itaconic acid, itaconic anhydride, methacrylic acid, maleic acid, maleic anhydride, fumaric acid, fumaric anhydride, citraconic acid, citraconic anhydride, glutaconic acid, vinylacetic acid, allylacetic acid, phosphinocarboxylic acid, α-haloacrylic acid, β-carboxylic acid, salts of these acids, and methacrylic acid alkyl esters such as methyl methacrylate, ethyl methacrylate, and octyl methacrylate.

When the acrylic acid-based polymer is a salt, it can be produced in such a manner that an acid-type acrylic acid monomer is polymerized alone or copolymerized with the monomer (b), and then is neutralized with a predetermined alkali. The salt may be, e.g., an ammonium salt of a copolymer of acrylic acid and 2-acrylamide-2-methylpropanesulfonic acid.

From the viewpoint of improving the dispersion stability, the acrylic acid-based polymer is preferably at least one selected from the group consisting of polyacrylic acid and ammonium polyacrylate, and more preferably ammonium polyacrylate.

From the viewpoint of improving the dispersion stability, the weight average molecular weight of the acrylic acid-based polymer is preferably 500 to 50000, more preferably 500 to 10000, and even more preferably 1000 to 10000.

In the present specification, the weight average molecular weight is calculated based on the peaks in a chromatogram that is obtained by a gel permeation chromatography (GPC) method under the following conditions.
Column: G4000PWXL+G2500PWXL (TOSO CORPORATION)
Eluant: (0.2 M phosphate buffer)/($CH_3CN$)=9/1 (volume ratio)
Flow rate: 1.0 mL/min
Column temperature: 40° C.
Detector: RI detector
Reference material: polyacrylic acid From the viewpoint of improving the dispersion stability, the content of the dispersing agent in the polishing liquid composition is preferably 0.0005 wt % or more, more preferably 0.001 wt % or more, and even more preferably 0.002 wt % or more. Moreover, the content of the dispersing agent in the polishing liquid composition is preferably 0.5 wt % or less, more preferably 0.1 wt % or less, and even more preferably 0.05 wt % or less. Accordingly, the content of the dispersing agent is preferably 0.0005 to 0.5 wt %, more preferably 0.001 to 0.1 wt %, and even more preferably 0.002 to 0.05 wt %.

Although the above content of each component is applied to the polishing liquid composition in use, the polishing liquid composition of this embodiment may be preserved and provided in the form of a concentrate as long as its stability is not impaired. This is preferred because the production and transportation costs can be reduced. The concentrate may be diluted appropriately with the above aqueous medium as needed.

When the polishing liquid composition of this embodiment is in the form of a concentrate, from the viewpoint of reducing the production and transportation costs, the content of the composite oxide particles is preferably 2 wt % or more, more preferably 3 wt % or more, even more preferably 5 wt % or more, and much more preferably 10 wt % or more. From the viewpoint of improving the dispersion stability, the content of the composite oxide particles is preferably 50 wt % or less, more preferably 40 wt % or less, and even more preferably 30 wt % or less. Accordingly, the content of the composite oxide particles is preferably 2 to 50 wt %, more preferably 3 to 40 wt %, even more preferably 5 to 30 wt %, and much more preferably 10 to 30 wt %.

The polishing liquid composition of this embodiment further may include at least one type of optional component selected from a pH adjuster, an antiseptic agent, and an oxidizing agent as long as the optional component does not interfere with the effect of the present invention.

The pH adjuster may be, e.g., a basic compound or an acid compound. Examples of the basic compound include ammonia, potassium hydroxide, water-soluble organic amine, and quaternary ammonium hydroxide. Examples of the acid compound include inorganic acid such as sulfuric acid, hydrochloric acid, nitric acid, or phosphoric acid and organic acid such as acetic acid, oxalic acid, succinic acid, glycolic acid, malic acid, citric acid, or benzoic acid.

The antiseptic agent may be, e.g., benzalkonium chloride, benzethonium chloride, 1,2-benzisothiazoline-3-one, (5-chloro-)2-methyl-4-isothiazoline-3-one, hydrogen peroxide, or hypochlorite.

The oxidizing agent may be, e.g., peroxides such as permanganic acid and peroxoacid, chromic acid, nitric acid, or salts thereof.

The pH of the polishing liquid composition of this embodiment at 25° C. is not particularly limited, but is preferably 2 to 10, more preferably 3 to 9, even more preferably 4 to 8, and much more preferably 4.5 to 7, since the polishing rate can be improved further. In this case, the pH of the polishing liquid composition at 25° C. can be measured with a pH meter (HM-30G manufactured by DKK-TOA CORPORATION) and is read on the pH meter 1 minute after dipping an electrode into the polishing liquid composition.

Next, an example of a method for producing the polishing liquid composition of this embodiment will be described.

The method for producing the polishing liquid composition of this embodiment is not limited at all. For example, the polishing liquid composition may be produced by mixing the composite oxide particles, the dispersing agent, the aqueous medium, and the optional component as needed.

The composite oxide particles can be dispersed in the aqueous medium, e.g., using an agitator such as a homomixer, a homogenizer, an ultrasonic disperser, a wet ball mill, or a bead mill. After dispersing the composite oxide particles in the aqueous medium, if coarse particles resulting from the aggregation or the like of the composite oxide particles are present in the aqueous medium, it is preferable that the coarse particles should be removed by centrifugal separation or filtration. The composite oxide particles are dispersed preferably in the presence of the dispersing agent.

Next, a polishing method using the polishing liquid composition of this embodiment will be described.

In an example of the polishing method using the polishing liquid composition of this embodiment, the polishing liquid composition is supplied between the object to be polished and a polishing pad of a polishing apparatus, and the polishing pad is moved relative to the object to be polished while the object to be polished is in contact with the polishing pad, thereby polishing the object to be polished.

The polishing pad is attached, e.g., to a polishing platen such as a rotary table. The object to be polished is held by a carrier or the like. The polishing apparatus may be either a double-sided polishing apparatus capable of polishing both principal surfaces of a plate-shaped object to be polished simultaneously or a single-sided polishing apparatus capable of polishing only one principal surface of the plate-shaped object to be polished.

(Polishing of a Base Material of a Glass Substrate)

The material of a polishing pad used to polish a base material of a glass substrate is not particularly limited, and any conventionally known materials can be used.

Examples of the base material to be polished include quartz glass, soda lime glass, aluminosilicate glass, borosilicate glass, aluminoborosilicate glass, non-alkali glass, crystallized glass, and glassy carbon. Among them, the polishing liquid composition of this embodiment is suitable for the polishing of the base material of an aluminosilicate glass substrate (which is an example of a tempered glass substrate), the base material that is turned into a glass ceramic substrate (i.e., crystallized glass substrate) by polishing, and the base material that is turned into a synthetic quartz glass substrate by polishing. The base material of the aluminosilicate glass substrate has good chemical durability and is less susceptible to damage (e.g., defects in concave portions) caused by alkali cleaning that is performed to remove residual particles from the polished substrate, so that a glass substrate with higher surface quality can be provided. The synthetic quartz glass substrate is preferred because of its excellent optical characteristics such as transmittance.

The shape of the base material of the glass substrate is not particularly limited. For example, the base material may have a shape with flat portions such as a disk, a plate, a slab, or a prism and a shape with curved portions such as a lens. The polishing liquid composition of this embodiment is suitable particularly for the polishing of the base material of the glass substrate in the form of a disk or plate.

From the viewpoint of improving the polishing rate, the polishing load applied to the base material of the glass substrate by the polishing apparatus is preferably 3 kPa or more, more preferably 4 kPa or more, even more preferably 5 kPa or more, and much more preferably 5.5 kPa or more. From the viewpoint of improving the quality of the polished surface and relieving the residual stress of the polished surface, the polishing load is preferably 12 kPa or less, more preferably 11 kPa or less, even more preferably 10 kPa or less, and much more preferably 9 kPa or less. Accordingly, the polishing load is preferably 3 to 12 kPa, more preferably 4 to 11 kPa, even more preferably 5 to 10 kPa, and much more preferably 5.5 to 9 kPa.

The supply rate of the polishing liquid composition varies depending on the following factors: the sum of the area of a surface of the polishing pad facing the object to be polished and the area of a surface of the base material of the glass substrate that is to be polished; and the composition of the polishing liquid composition. From the viewpoint of improving the polishing rate, the supply rate is preferably 0.06 to 5 ml/min, more preferably 0.08 to 4 ml/min, and even more preferably 0.1 to 3 ml/min per 1 $cm^2$ of the surface to be polished.

The number of revolutions of the polishing pad is preferably 10 to 200 rpm, more preferably 20 to 150 rpm, and even more preferably 30 to 60 rpm. The number of revolutions of the object to be polished is preferably 10 to 200 rpm, more preferably 20 to 150 rpm, and even more preferably 30 to 60 rpm.

(Polishing of a Thin Film During the Manufacturing Process of a Semiconductor Device)

The polishing liquid composition of this embodiment also can be used, e.g., to polish a thin film that is disposed on one principal surface side of a semiconductor substrate.

Examples of the material of the semiconductor substrate include an elementary semiconductor such as Si or Ge, a compound semiconductor such as GaAs, InP, or CdS, and a mixed crystal semiconductor such as InGaAs or HgCdTe.

Examples of the material of the thin film include the following materials constituting a semiconductor device: a metal such as aluminum, nickel, tungsten, copper, tantalum, or titanium; a semimetal such as silicon; an alloy containing any of these metals as the main component; a glass material such as glass, glassy carbon, or amorphous carbon; a ceramic material such as alumina, silicon dioxide, silicon nitride, tantalum nitride, or titanium nitride; and a resin such as a polyimide resin. In particular, the thin film preferably includes silicon, and more preferably includes at least one selected from the group consisting of silicon oxide, silicon nitride, and polysilicon, since such a thin film can be polished at a high speed. The silicon oxide may be, e.g., silicon dioxide or tetraethoxysilane (TEOS). The thin film including the silicon oxide may be doped with elements such as phosphorus and boron. Specific examples of such a thin film include a BPSG (boro-phospho-silicate glass) film and a PSG (phospho-silicate glass) film.

A method for forming the thin film may be selected appropriately in accordance with the material constituting the thin film. For example, a CVD method, a PVD method, a coating method, and a plating method can be used.

From the viewpoint of improving the polishing rate, the polishing load applied to the thin film by the polishing apparatus while the thin film is polished is preferably 5 kPa or more, and more preferably 10 kPa or more. From the viewpoint of improving the quality of the polished surface and relieving the residual stress of the polished surface, the polishing load is preferably 100 kPa or less, more preferably 70 kPa or less, and even more preferably 50 kPa or less. Accordingly, the polishing load is preferably 5 to 100 kPa, more preferably 10 to 70 kPa, and even more preferably 10 to 50 kPa.

The supply rate of the polishing liquid composition varies depending on the following factors: the sum of the area of a surface of the polishing pad facing the object to be polished and the area of a surface of the thin film that is to be polished; and the composition of the polishing liquid composition. From the viewpoint of improving the polishing rate, the supply rate is preferably 0.01 ml/min or more, and more preferably 0.1 ml/min or more per 1 $cm^2$ of the surface of the object to be polished. From the viewpoint of reducing the cost and facilitating the disposal of liquid wastes, the supply rate of the polishing liquid composition is preferably 10 ml/min or less, and more preferably 5 ml/min or less per 1 $cm^2$ of the surface to be polished. Accordingly, the supply rate of the polishing liquid composition is preferably 0.01 to 10 ml/min, and more preferably 0.1 to 5 ml/min per 1 cm$^2$ of the surface to be polished.

The material or the like of the polishing pad used in the polishing process is not particularly limited, and any conventionally known materials can be used. Examples of the material of the polishing pad include an organic polymer foam such as a rigid polyurethane foam and an inorganic foam. In particular, the rigid polyurethane foam is preferred.

The number of revolutions of the polishing pad is preferably 30 to 200 rpm, more preferably 45 to 150 rpm, and even more preferably 60 to 100 rpm.

The thin film may have an uneven surface. The thin film with an uneven surface can be produced, e.g., by a) a thin film formation process of forming a thin film on one principal surface side of the semiconductor substrate and b) an uneven surface formation process of forming a concavo-convex pattern on the surface of the thin film that is opposite to the surface facing the semiconductor substrate. The concavo-convex pattern can be formed by a conventionally known lithography technique or the like. In some cases, the surface of the thin film that is opposite to the surface facing the semiconductor substrate may have a concavo-convex pattern corresponding to a convexo-concave pattern of the lower layer. It is preferable that the conditions such as the polishing load, the supply rate of the polishing liquid composition, the material of the polishing pad, and the number of revolutions of the polishing pad for polishing the thin film with an uneven surface are the same as those for polishing the above thin film.

The polishing of the thin film of this embodiment is suitable in the case where a difference in level (H) between the mutually adjacent convex and concave portions (see FIG. 1C or 3A) is preferably 50 to 2000 nm, and more preferably 100 to 1500 nm. The "difference in level (H)" means a distance between the top of the convex portion and the bottom of the concave portion, and can be determined with a profile measuring apparatus (HRP-100 manufactured by KLA-Tencor Corporation).

The polishing liquid composition of this embodiment can be applied to any type of polishing during the manufacturing process of the semiconductor device. Specific examples include (1) polishing performed in the process of forming a buried isolation film, (2) polishing performed in the process of flattening an interlayer insulating film, (3) polishing performed in the process of forming buried metal wiring (damascene interconnect etc.), and (4) polishing performed in the process of forming a buried capacitor.

Examples of the semiconductor device include a memory IC (integrated circuit), a logic IC, and a system LSI (large-scale integration).

The polishing liquid composition of this embodiment also can be used to polish the base material of a crystallized glass substrate such as a glass-ceramic substrate, the base material of a synthetic quartz glass substrate used as a photomask substrate, or the glass surface or the like of a liquid crystal display panel in addition to the base material of the glass substrate constituting a hard disk or the like and the insulating layer constituting the semiconductor device.

Next, the polishing performed in the process of forming a buried isolation film during the manufacturing process of the semiconductor device will be described with reference to the drawings.

Figure 1B:
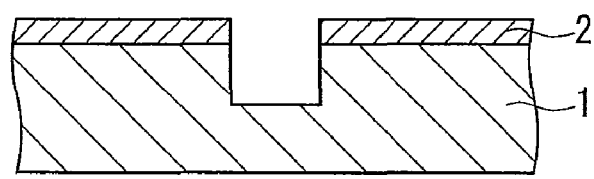
FIG. 1B is a cross-sectional view showing an example of a step in a manufacturing method of a semiconductor device of the present invention or in a polishing method of the present invention.
Figure 1C:
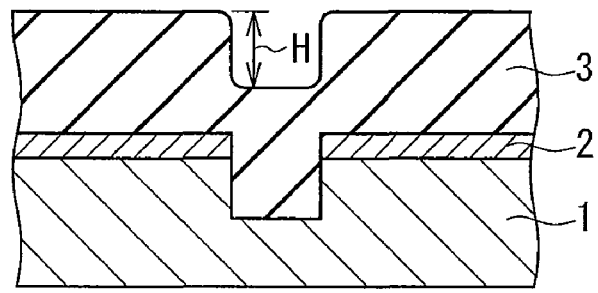
FIG. 1C is a cross-sectional view showing an example of a step in a manufacturing method of a semiconductor device of the present invention or in a polishing method of the present invention.
Figure 1D:
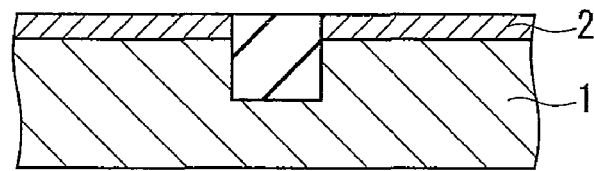
FIG. 1D is a cross-sectional view showing an example of a step in a manufacturing method of a semiconductor device of the present invention or in a polishing method of the present invention.

As shown in FIG. 1A, a silicon nitride (SiN$_4$) film 2 is formed, e.g., by a CVD (chemical vapor deposition) method on a silicon dioxide oxide film (not shown) that is obtained by exposing a semiconductor substrate 1 to oxygen in an oxidation furnace. Then, as shown in FIG. 1B, a shallow trench is formed by a photolithography technique. Next, as shown in FIG. 1C, an oxide film (SiO$_2$ film) 3 for covering the trench is formed, e.g., by a CVD method using a silane gas and an oxygen gas. The surface of the oxide film 3 that is opposite to the surface facing the semiconductor substrate 1 has a convexo-concave pattern with a difference in level H, and this convexo-concave pattern corresponds to the convexo-concave pattern of the lower layer. Subsequently, the oxide film 3 is polished until its surface is substantially flush with the surface of the silicon nitride film 2 by a CMP method (see FIG. 1D). The polishing liquid composition of this embodiment is used for this polishing by the CMP method.

Next, the polishing performed in the process of flattening an interlayer insulating film during the manufacturing process of the semiconductor device will be described with reference to the drawings.

Figure 2A:
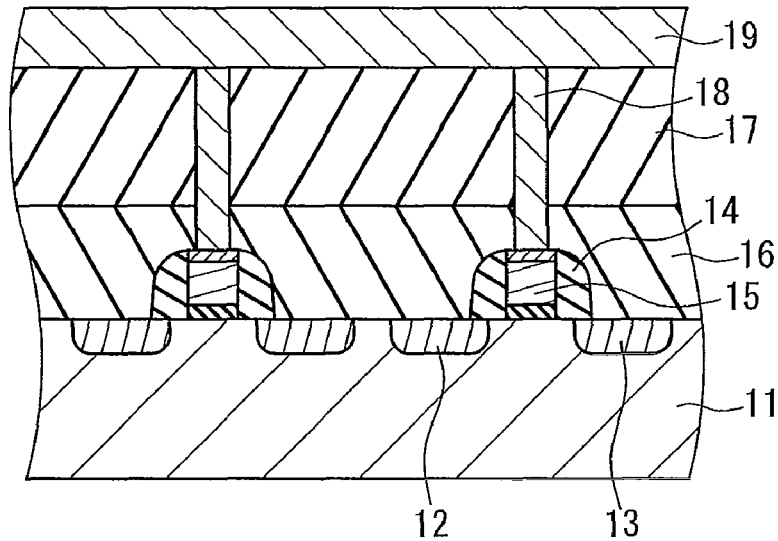
FIG. 2A is a cross-sectional view showing an example of a step in a manufacturing method of a semiconductor device of the present invention or in a polishing method of the present invention.

As shown in FIG. 2A, a metal thin film 19 (e.g., an Al thin film) is formed, e.g., by sputtering on one principal surface side of a semiconductor substrate 11. In the example of FIG. 2A, a source 12 and a drain 13 are formed as impurity diffusion regions doped with impurities in the semiconductor substrate 11. In FIG. 2A, the following components underlie the metal thin film 19: a gate electrode 15 whose surface is silicided; sidewalls 14 located at both ends of the gate electrode 15; insulating layers 16, 17 made of SiO$_2$ or the like; and a tungsten plug 18 that penetrates the insulating layers 16, 17 to make an interlayer connection between the metal thin film 19 and the gate electrode 15.

Figure 2B:
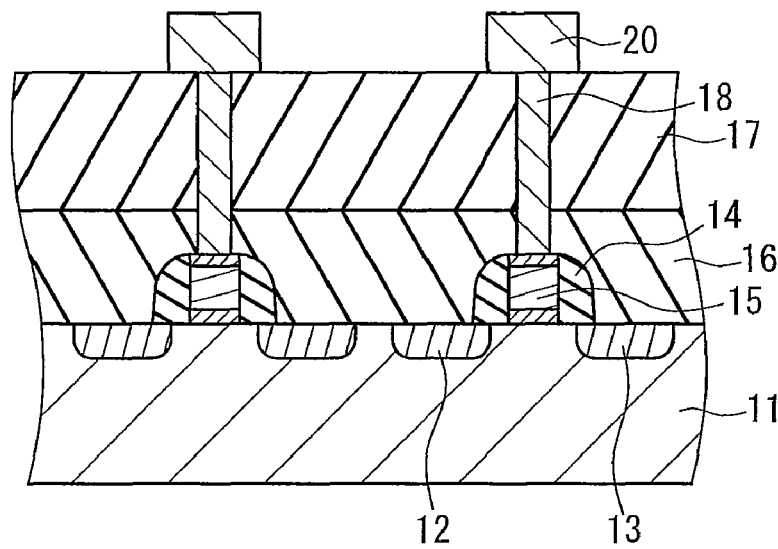
FIG. 2B is a cross-sectional view showing an example of a step in a manufacturing method of a semiconductor device of the present invention or in a polishing method of the present invention.

Next, as shown in FIG. 2B, the metal thin film 19 is patterned by a photolithography technique and a dry etching technique, so that extraction electrodes 20 are formed. Thus, a CMOS structure is completed.

Figure 3A:
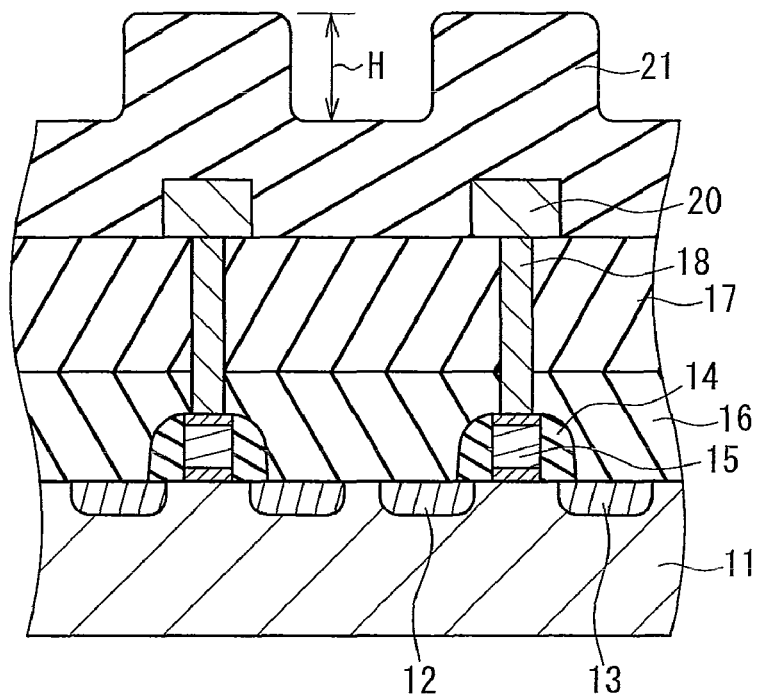
FIG. 3A is a cross-sectional view showing an example of a step in a manufacturing method of a semiconductor device of the present invention or in a polishing method of the present invention.
Figure 3B:
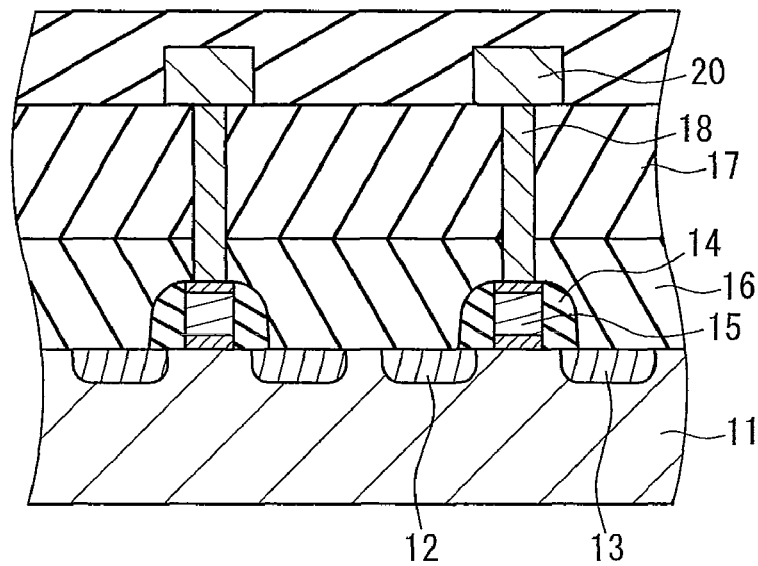
FIG. 3B is a cross-sectional view showing an example of a step in a manufacturing method of a semiconductor device of the present invention or in a polishing method of the present invention.

Next, as shown in FIG. 3A, an oxide film (SiO$_2$ film) 21 is formed, e.g., by a CVD method using a silane gas and an oxygen gas. The surface of the oxide film 21 that is opposite to the surface facing the semiconductor substrate 11 has a convexo-concave pattern with a difference in level H, and this convexo-concave pattern corresponds to the convexo-concave pattern of the lower layer. Subsequently, the oxide film 21 is polished by a CMP method (see FIG. 3B). The polishing liquid composition of this embodiment is used for this polishing by the CMP method.

As described above, the present invention can provide a polishing liquid composition capable of polishing an object to be polished at a higher speed, a polishing method using this polishing liquid composition, a method for manufacturing a glass substrate, and a method for manufacturing a semiconductor device.

Embodiment 2

In Embodiment 2, another example of a polishing liquid composition of the present invention will be described.

The polishing liquid composition of this embodiment includes a water-soluble organic compound that contributes to the formation of a polished surface with high flatness in addition to the above described composite oxide particles.

The polishing liquid composition of this embodiment can provide not only a polished surface with high flatness by including the water-soluble organic compound as an additive, but also a high polishing rate by using the composite oxide particles containing cerium and zirconia as abrasive particles, which have never been known before.

The reason for this can be considered as follows. In the polishing liquid composition of this embodiment, the composite oxide particles containing cerium and zirconium can act as abrasive grains for polishing the object to be polished at a high speed, as will be described later. When the polishing liquid composition of this embodiment is supplied to the surface to be polished, the water-soluble organic compound adsorbs to the surfaces of the composite oxide particles and/or the surface to be polished, and thus forms a coating. This coating interferes with the action of the composite oxide particles on the surface to be polished. The coating is broken after a large polishing load is applied to the surface to be polished, and then this surface can be polished with the composite oxide particles.

When an uneven surface is polished as an example of the surface to be polished, the polishing progress can be assumed microscopically as follows. During the early stage, a larger polishing load than the set load of the polishing apparatus is applied to the convex portions, so that the coating is broken and the convex portions are increasingly polished. On the other hand, since a lower polishing load is applied to the concave portions, the concave portions are protected by the coating and not likely to be polished. In other words, the convex portions are selectively polished to reduce the difference in level between the convex and concave portions, and thus planarization proceeds.

As described above, the use of the polishing liquid composition of this embodiment, combined with the effect of the composite oxide particles capable of high speed polishing, can provide a polished surface with excellent flatness in a short time. However, the present invention is not limited to these assumptions.

If the set load of the polishing apparatus is set so that a flat surface is not substantially polished, then the polishing hardly proceeds after the difference in level between the convex and concave portions is eliminated. This is preferred because excessive polishing can be easily prevented.

The water-soluble organic compound may have at least one selected from —$SO_3H$ group, —$SO_3N_a$ group ($N_a$ is an atom or atomic group that can substitute for the H atom to form a salt), —COOH group, and —$COON_b$ group ($N_b$ is an atom or atomic group that can substitute for the H atom to form a salt). When the water-soluble organic compound is a salt, it is preferably a non-metallic salt that does not contain an alkali metal. The polishing liquid composition may include one or more types of water-soluble organic compounds.

The water-soluble organic compound may be, e.g., at least one selected from the group consisting of a water-soluble acrylic acid-based polymer, organic acid and its salt, acidic amino acid and its salt, neutral or basic amino acid, and an amphoteric water-soluble low-molecular weight organic compound (also referred to simply as a low-molecular weight organic compound in the following). From the viewpoint of ensuring the stability of the polishing liquid composition, the molecular weight of the low-molecular weight organic compound is preferably 1000 or less, more preferably 500 or less, and even more preferably 300 or less.

As an example of the water-soluble organic compound, the water-soluble acrylic acid-based polymer included in the polishing liquid composition of this embodiment may be, e.g., polyacrylic acid or acrylic acid-based copolymer. The polyacrylic acid includes a polymer having a constitutional unit (A) derived from at least one monomer (a) selected from the group consisting of acrylic acid and a non-metallic salt of acrylic acid. The water-soluble acrylic acid-based polymer may be, e.g., a copolymer having the constitutional unit (A) and a constitutional unit (B) derived from the following monomer (b).

The non-metallic salt of acrylic acid may be, e.g., an acrylic acid ammonium salt, an acrylic acid amine salt, or an acrylic acid tetraalkylammonium salt. The water-soluble acrylic acid-based polymer may include one or more constitutional units derived from these acrylates.

The constitutional unit (A) of the acrylic acid-based copolymer is more than 50 mol % of the total constitutional unit, but preferably more than 70 mol %, more preferably more than 80 mol %, and even more preferably more than 90 mol %.

The monomer (b) contains a polymerizable double bond. Examples of the monomer (b) include the following: carboxylic acid-based monomers such as itaconic acid, methacrylic acid, maleic acid, fumaric acid, citraconic acid, glutaconic acid, vinylacetic acid, allylacetic acid, phosphinocarboxylic acid, α-haloacrylic acid, and β-carboxylic acid or salts of these acids; sulfonic acid-based monomers such as 2-acrylamide-2-methylpropanesulfonic acid, styrenesulfonic acid, vinylsufonic acid, allylsulfonic acid, and methallylsulfonic acid or salts of these acids; phosphoric acid-based monomers such as acid phosphooxyethyl (meth)acrylate, acid phosphooxypropyl (meth)acrylate, and 3-(meth)acryloyl oxypropyl phosphonate or salts of these acids; (meth)acrylate alkyl ester-based monomers such as methyl (meth)acrylate, ethyl (meth)acrylate, octyl (meth)acrylate, 2-hydroxyethyl (meth)acrylate, polyethylene glycol (meth)acrylate, and methoxypolyethylene glycol (meth)acrylate; N-alkyl substituted (meth)acrylamide-based monomers such as N, N-dimethyl (meth)acrylamide and N, N-diethyl (meth)acrylamide; aromatic vinyl-based monomers such as styrene; α-olefin-based monomers such as isobutylene and diisobutylene; vinyl ether-based monomers such as vinyl methyl ether and vinyl ethyl ether; nitrile-based monomers such as (meth)acrylonitrile; and vinyl ester-based monomers such as vinyl acetate and vinyl propionate.

The water-soluble acrylic acid-based polymer may be in the form of either free acid or salt. Generally the water-soluble acrylic acid-based polymer is used in the form of free acid or salt to produce the polishing liquid composition. However, the salt is preferred for the production of the polishing liquid composition because of its high solubility in the aqueous medium.

The salt of the water-soluble acrylic acid-based polymer can be produced in such a manner that an acid-type acrylic acid monomer is polymerized alone or copolymerized with the monomer (b), and then is neutralized with a predetermined alkali at a predetermined rate. The preferred examples of the salt include an ammonium compound salt, a lithium salt, a sodium salt, a potassium salt, and a cesium salt. From the viewpoint of achieving the favorable electric characteristics of LSI, the ammonium compound salt is more preferred.

The preferred examples of amines constituting the ammonium compound salt include ammonia, primary, secondary, and tertiary amines having a straight or branched chain saturated or unsaturated alkyl group with a carbon number of 1 to 10, primary, secondary, and tertiary amines having at least one aromatic ring with a carbon number of 6 to 10, amine having a cyclic structure such as piperidine or piperazine, and a tetraalkylammonium compound such as tetramethylammonium.

From the viewpoint of the solubility in the aqueous medium and the dispersion stability, it is preferable that the salt of the water-soluble acrylic acid-based polymer is neutralized at a predetermined rate in accordance with the type of the water-soluble acrylic acid-based polymer.

From the viewpoint of suppressing a dishing phenomenon due to excessive polishing and providing a polished surface with excellent flatness, the following water-soluble acrylic acid-based polymers are preferred. The dishing phenomenon indicates that while the uneven surface is polished, the concave portions are excessively polished, and thus the portions of the polished surface that particularly correspond to those concave portions are recessed like a dish. Such a dishing phenomenon occurs more conspicuously as a distance between the adjacent convex portions increases, that is, the proportion of the entire area of the concave portions shown in a plan view of the uneven surface becomes larger (i.e., the surface density of the concave portion becomes larger).

The preferred examples of the water-soluble acrylic acid-based polymer include polyacrylic acid, polymethacrylic acid, ammonium polyacrylate, ammonium polymethacrylate, a polyacrylic acid ammonium salt, an ammonium salt of a copolymer of acrylic acid and maleic acid, an ammonium salt of a copolymer of acrylic acid and 2-acrylamide-2-methylpropanesulfonic acid, and an ammonium salt of a copolymer of acrylic acid and methyl (meth)acrylate. In particular, the polyacrylic acid ammonium salt is more preferred.

From the viewpoint of suppressing a dishing phenomenon due to excessive polishing, providing a polished surface with excellent flatness, and achieving the dispersion stability of the abrasive grains, the weight average molecular weight of the water-soluble acrylic acid-based polymer is preferably 300 to 100000, more preferably 500 to 50000, even more preferably 1000 to 30000, and much more preferably 2000 to 10000. It is preferable that the weight average molecular weight of the salt of the water-soluble acrylic acid-based polymer also falls in the above ranges for the same reason. When the water-soluble acrylic acid-based polymer is ammonium polyacrylate, the weight average molecular weight is preferably 1000 to 20000, and more preferably 2000 to 10000.

When the polishing liquid composition includes ammonium polyacrylate as the water-soluble acrylic acid-based polymer, from the viewpoint of providing a polished surface with more excellent flatness, the content of the ammonium polyacrylate in the polishing liquid composition is preferably 0.1 to 15 wt %, more preferably 0.2 to 10 wt %, even more preferably 0.5 to 8 wt %, and much more preferably 1.0 to 6 wt %.

From the viewpoint of effectively suppressing the occurrence of dishing, the weight ratio of the ammonium polyacrylate to the composite oxide particles (ammonium polyacrylate/composite oxide particles) in the polishing liquid composition of this embodiment is preferably 1/5 or more, more preferably 1/4 or more, and even more preferably 1/3 or more. From the viewpoint of further improving the polishing rate, the weight ratio (ammonium polyacrylate/composite oxide particles) is preferably 15/1 or less, more preferably 12/1 or less, and even more preferably 10/1 or less. Accordingly, the weight ratio is preferably 1/5 to 15/1, more preferably 1/4 to 12/1, and even more preferably 1/3 to 10/1.

As an example of the water-soluble organic compound, the preferred examples of the organic acid and its salt included in the polishing liquid composition of this embodiment include malic acid, lactic acid, tartaric acid, gluconic acid, citric acid hydrate, succinic acid, adipic acid, fumaric acid, and ammonium salts of these acids.

As an example of the water-soluble organic compound, the preferred examples of the acidic amino acid and its salt included in the polishing liquid composition of this embodiment include aspartic acid, glutamic acid, and ammonium salts of these acids.

As an example of the water-soluble organic compound, the preferred examples of the neutral or basic amino acid included in the polishing liquid composition of this embodiment include glycine, 4-aminobutyric acid, 6-aminohexanoic acid, 12-aminolauric acid, arginine, and glycylglycine.

As an example of the water-soluble compound, the preferred examples of the low-molecular weight organic compound included in the polishing liquid composition of this embodiment include dihydroxyethylglycine (DHEG), ethylenediaminetetraacetic acid (EDTA), cyclohexanediaminetetraacetic acid (CyDTA), nitrilotriacetic acid (NTA), hydroxyethylethylenediaminetriacetic acid (HEDTA), diethylenetriaminepentaacetic acid (DTPA), triethylenetetraminehexaacetic acid (TTHA), L-glutamic acid diacetic acid (GLDA), aminotri(methylenephosphonic acid), 1-hydroxyethylidene1,1-diphosphonic acid (HEDP), ethylenediaminetetra(methylenephosphonic acid), diethylenetriaminepenta(methylenephosphonic acid), β-alaninediacetic acid (β-ADA), α-alaninediacetic acid (α-ADA), aspartic acid diacetic acid (ASDA), ethylenediaminedisuccinic acid (EDDS), iminodiacetic acid (IDA), hydroxyethyliminodiacetic acid (HEIDA), 1,3-propanediaminetetraacetic acid (1,3-PDTA), aspartic acid, serine, cysteine, azaserine, asparagine, 2-aminobutyric acid, 4-aminobutyric acid, alanine, β-alanine, arginine, alloisoleucine, allothreonine, isoleucine, ethionine, ergothioneine, ornithine, canavanine, S-(carboxymethyl)-cysteine, kynurenine, glycine, glutamine, glutamic acid, creatine, sarcosine, cystathionine, cystine, cysteic acid, citrulline, β-(3,4-dihydroxyphenyl)-alanine, 3,5-diiodotyrosine, taurine, thyroxine, tyrosine, tryptophan, threonine, norvaline, norleucine, valine, histidine, 4-hydroxyproline, δ-hydroxylysine, phenylalanine, proline, homoserine, methionine, 1-methylhistidine, 3-methylhistidine, lanthionine, lysine, leucine, m-aminobenzoic acid, p-aminobenzoic acid, β-aminoisovaleric acid, 3-aminocrotonic acid, o-aminocinnamic acid, m-aminobenzenesulfonic acid, p-aminobenzenesulfonic acid, 2-aminopentanoic acid, 4-aminopentanoic acid, 5-aminopentanoic acid, 2-amino-2-methylbutyric acid, 3-aminobutyric acid, isatic acid, 2-quinolinecarboxylic acid, 3-quinolinecarboxylic acid, 4-quinolinecarboxylic acid, 5-quinolinecarboxylic acid, 2,3-quinolinedicarboxylic acid, 2,4-quinolinedicarboxylic acid, guanidinoacetic acid, 2,3-diaminobenzoic acid, 2,4-diaminobenzoic acid, 2,5-diaminobenzoic acid, 3,4-diaminobenzoic acid, 3,5-diaminobenzoic acid, 2,4-diarninophenol, 3,4-diaminophenol, 2,4,6-triaminophenol, 2-pyridinecarboxylic acid, nicotinic acid, isonicotinic acid, 2,3-pyridinedicarboxylic acid, 2,4-pyridinedicarboxylic acid, 2,5-pyridinedicarboxylic acid, 2,6-pyridinedicarboxylic acid, 3,4-pyridinedicarboxylic acid, 3,5-pyridinedicarboxylic acid, 2,4,5-pyridinetricarboxylic acid, 2,4,5-pyridinetricarboxylic acid, 3,4,5-pyridinetricarboxylic acid, N-phenylglycine, N-phenylglycine-o-carboxylic acid, phenol-2,4-disulfonic acid, o-phenolsulfonic acid, m-phenolsulfonic acid, p-phenolsulfonic acid, phthalanilic acid, o-(methylamino)phenol, m-(methylamino)phenol, p-(methylamino)phenol, carboxybetaine, sulfobetaine, imidazolinium betaine, and lecithin. The preferred examples of the low-molecular weight organic compound also include dielectric substances obtained by substituting atoms such as F, Cl, Br, and I or atomic groups such as OH, CN, and $NO_2$ for one or more protons of these compounds. In particular, from the viewpoint of suppressing a dishing phenomenon due to excessive polishing and providing a polished surface with excellent flatness, the following chelating agents are more preferred.

The chelating agents include DHEG, EDTA, CyDTA, NTA, HEDTA, DTPA, TTHA, GLDA, aminotri(methylenephosphonic acid), HEDP, ethylenediaminetetra(methylenephosphonic acid), diethylenetriaminepenta(methylenephosphonic acid), β-ADA, α-ADA, ASDA, EDDS, IDA, HEIDA, 1,3-PDTA, aspartic acid, serine, and cysteine. Among them, DHEG, EDTA, NTA, β-ADA, α-ADA, ASDA, EDDS, HEIDA, aspartic acid, serine, and cysteine are more preferred.

From the viewpoint of ensuring the stability of the polishing liquid composition when it is concentrated, DHEG is even more preferred in the chelating agents.

In the above amphoteric water-soluble low-molecular weight organic compounds, particularly DHEG, in which an anionic group, a cationic group, and a nonionic group are present in balance in the molecules, does not significantly reduce the zeta potential or hydrophilicity of the composite oxide particles even if DHEG adsorbs to the composite oxide particles, and DHEG also is considered to have little influence on the effect of a dispersing agent. Moreover, DHEG can suppress the aggregation or the like of the composite oxide particles sufficiently, and therefore can ensure the dispersion stability of the composite oxide particles even if the concentration of the composite oxide particles is high. Thus, the polishing liquid composition of this embodiment that includes DHEG may be provided as a high-concentration polishing liquid composition with stable quality.

Generally, the low-molecular weight organic compound is used in the form of free acid or salt to produce the polishing liquid composition. However, the salt is preferred for the production of the polishing liquid composition because of its high solubility in the aqueous medium.

The preferred examples of the salt include an ammonium compound salt, a lithium salt, a sodium salt, a potassium salt, and a cesium salt. From the viewpoint of achieving the favorable electric characteristics of LSI, the ammonium compound salt is more preferred.

The preferred examples of amines constituting the ammonium compound salt include ammonia, primary, secondary, and tertiary amines having a straight or branched chain saturated or unsaturated alkyl group with a carbon number of 1 to 10, primary, secondary, and tertiary amines having at least one aromatic ring with a carbon number of 6 to 10, amine having a cyclic structure such as piperidine or piperazine, and a tetraalkylammonium compound such as tetramethylammonium.

From the viewpoint of providing a polished surface with excellent flatness, the content of the water-soluble organic compound in the polishing liquid composition of this embodiment is preferably 0.02 to 15 wt %, more preferably 0.05 to 10 wt %, even more preferably 0.1 to 8 wt %, and much more preferably 0.2 to 6 wt %.

In the polishing liquid composition of the present invention, the substance added as the water-soluble organic compound may be either the same as or different from the substance added as a dispersing agent, which will be described later. When the substance added as the water-soluble organic compound is the same as that added as the dispersing agent, the total amount of the water-soluble organic compound and the dispersing agent may be selected from the range of the sum of preferred contents of the water-soluble organic compound (e.g., 0.02 to 15 wt %) and the dispersing agent (e.g., 0.0005 to 0.5 wt %) so as to achieve good dispersibility and good flatness of the polished surface.

From the viewpoint of providing a polished surface with high flatness, the weight ratio of the water-soluble organic compound to the composite oxide particles (water-soluble organic compound/composite oxide particles) in the polishing liquid composition of this embodiment is preferably 1/30 or more, more preferably 1/20 or more, and even more preferably 1/10 or more. From the viewpoint of further improving the polishing rate, the weight ratio is preferably 15/1 or less, more preferably 12/1 or less, and even more preferably 10/1 or less. Accordingly, the weight ratio is preferably 1/30 to 15/1, more preferably 1/20 to 12/1, and even more preferably 1/10 to 10/1.

When the polishing liquid composition includes DHEG as the water-soluble organic compound, from the viewpoint of providing a polished surface with more excellent flatness, the content of DHEG in the polishing liquid composition is preferably 0.1 to 15 wt %, more preferably 0.2 to 10 wt %, even more preferably 0.5 to 8 wt %, and much more preferably 1.0 to 6 wt %.

From the viewpoint of effectively suppressing the occurrence of dishing, the weight ratio of DHEG to the composite oxide particles (DHEG/composite oxide particles) in the polishing liquid composition of this embodiment is preferably 1/5 or more, more preferably 1/4 or more, and even more preferably 1/3 or more. From the viewpoint of further improving the polishing rate, the weight ratio (DHEG/composite oxide particles) is preferably 15/1 or less, more preferably 12/1 or less, and even more preferably 10/1 or less. Accordingly, the weight ratio is preferably 1/5 to 15/1, more preferably 1/4 to 12/1, and even more preferably 1/3 to 10/1.

The aqueous medium included in the polishing liquid composition of this embodiment may be the same as that included in the polishing liquid composition of Embodiment 1.

The type, content, weight average molecular weight, etc. of the dispersing agent included in the polishing liquid composition of this embodiment may be the same as those of the dispersing agent included in the polishing liquid composition of Embodiment 1.

The polishing liquid composition of this embodiment further may include at least one type of optional component selected from a pH adjuster, an antiseptic agent, and an oxidizing agent as long as the optional component does not interfere with the effect of the present invention. The specific examples of these optional components may be the same as those described in Embodiment 1. The preferred pH of the polishing liquid composition at 25° C. may be the same as that of the polishing liquid composition of Embodiment 1.

Although the above content of each component is applied to the polishing liquid composition in use, the polishing liquid composition of this embodiment may be preserved and provided in the form of a concentrate as long as its stability is not impaired. This is preferred because the production and transportation costs can be reduced further. The concentrate may be diluted appropriately with the above aqueous medium as needed.

When the polishing liquid composition of this embodiment is in the form of a concentrate, from the viewpoint of further reducing the production and transportation costs, the content of the composite oxide particles is preferably 1 wt % or more, more preferably 2 wt % or more, even more preferably 3 wt % or more, and much more preferably 4 wt % or more. From the viewpoint of further improving the dispersion stability, the content of the composite oxide particles is preferably 20 wt % or less, more preferably 15 wt % or less, even more preferably 10 wt % or less, and much more preferably 8 wt % or less. Accordingly, the content of the composite oxide particles in the concentrate is preferably 1 to 20 wt %, more preferably 2 to 15 wt %, even more preferably 3 to 10 wt %, and much more preferably 4 to 8 wt %.

When the polishing liquid composition of this embodiment is in the form of a concentrate, from the viewpoint of further reducing the production and transportation costs, the content of the water-soluble organic compound is preferably 0.08 wt % or more, more preferably 0.2 wt % or more, even more preferably 0.5 wt % or more, and much more preferably 1 wt % or more. From the viewpoint of further improving the dispersion stability, the content of the water-soluble organic compound in the concentrate is preferably 40 wt % or less, more preferably 20 wt % or less, even more preferably 15 wt % or less, and much more preferably 12 wt % or less. Accordingly, the content of the water-soluble organic compound in the concentrate is preferably 0.08 to 40 wt %, more preferably 0.2 to 20 wt %, even more preferably 0.5 to 15 wt %, and much more preferably 1 to 12 wt %.

When the polishing liquid composition including DHEG as the low-molecular weight organic compound is in the form of a concentrate, from the viewpoint of further reducing the production and transportation costs, the content of DHEG is preferably 0.4 wt % or more, more preferably 1 wt % or more, even more preferably 2 wt % or more, and much more preferably 3 wt % or more. From the viewpoint of further improving the dispersion stability, the content of DHEG in the concentrate is preferably 40 wt % or less, more preferably 20 wt % or less, even more preferably 15 wt % or less, and much more preferably 12 wt % or less. Accordingly, the content of DHEG in the concentrate is preferably 0.4 to 40 wt %, more preferably 1 to 20 wt %, even more preferably 2 to 15 wt %, and much more preferably 3 to 12 wt %.

When the polishing liquid composition of this embodiment is in the form of a concentrate, from the viewpoint of further reducing the production and transportation costs, the content of the dispersing agent is preferably 0.001 wt % or more, more preferably 0.003 wt % or more, even more preferably 0.005 wt % or more, and much more preferably 0.01 wt % or more. From the viewpoint of further improving the dispersion stability, the content of the dispersing agent in the concentrate is preferably 1.0 wt % or less, more preferably 0.3 wt % or less, even more preferably 0.2 wt % or less, and much more preferably 0.1 wt % or less. Accordingly, the content of the dispersing agent in the concentrate is preferably 0.001 to 1.0 wt %, more preferably 0.003 to 0.3 wt %, even more preferably 0.005 to 0.2 wt %, and much more preferably 0.01 to 0.1 wt %.

Next, an example of a method for manufacturing the polishing liquid composition of this embodiment will be described.

The method for producing the polishing liquid composition of this embodiment is not limited at all. For example, the polishing liquid composition may be produced by mixing the composite oxide particles, the dispersing agent, the water-soluble organic compound (DHEG, ammonium polyacrylate, etc.), the aqueous medium, and the optional component as needed.

The mixing order of these components is not particularly limited, and all the components may be mixed simultaneously. Alternatively, a composite oxide particle slurry may be prepared beforehand by dispersing the composite oxide particles in the aqueous medium in which the dispersing agent is dissolved, and then this slurry may be blended with a mixture including the water-soluble organic compound and the remaining aqueous medium. From the viewpoint of sufficiently preventing the aggregation or the like of the composite oxide particles, the latter is preferred.

The composite oxide particles can be dispersed in the aqueous medium, e.g., using an agitator such as a homomixer, a homogenizer, an ultrasonic disperser, a wet ball mill, or a bead mill. If coarse particles resulting from the aggregation or the like of the composite oxide particles are present in the aqueous medium, it is preferable that the coarse particles should be removed by centrifugal separation or filtration. The composite oxide particles are dispersed preferably in the presence of the dispersing agent.

Next, a method for manufacturing a semiconductor device of this embodiment will be described.

A method for manufacturing a semiconductor substrate of this embodiment includes the following: a thin film formation process of forming a thin film on one principal surface side of the semiconductor substrate; an uneven surface formation process of forming a concavo-convex pattern on the surface of the thin film that is opposite to the surface facing the semiconductor substrate; and a polishing process of polishing the uneven surface with the polishing liquid composition of this embodiment. The thin film formation process is performed multiple times as needed.

Another method for manufacturing a semiconductor substrate of this embodiment includes the following: a thin film formation process of forming a thin film with an uneven surface on one principal surface side of the semiconductor substrate; and a polishing process of polishing the uneven surface with the polishing liquid composition of this embodiment. The thin film formation process is performed multiple times as needed.

The thin film formed by the thin film formation process may be, e.g., an insulating layer or a conductor layer such as a metal layer or a semiconductor layer. The material of the insulating layer may be, e.g., silicon oxide, silicon nitride, or polysilicon.

A method for forming the thin film may be selected appropriately in accordance with the material constituting the thin film. For example, a CVD method, a PVD method, a coating method, and a plating method can be used.

The uneven surface may be formed by a conventionally known lithography technique or the like. In the lithography technique, photoresist coating, exposure, development, etching, removal of the photoresist, etc. are performed in this order. In some cases, the uneven surface may be formed so as to correspond to a concavo-convex pattern of the lower layer.

The uneven surface can be polished by supplying the polishing liquid composition of this embodiment to the uneven surface and/or the surface of a polishing pad, bringing, e.g., the polishing pad into contact with the uneven surface, and moving at least one of the thin film having the uneven surface and the polishing pad relative to the other while applying a predetermined pressure (load) to the uneven surface. The polishing treatment can be performed by a conventionally known polishing apparatus.

The polishing liquid composition may be used as it is or diluted if it is in the form of a concentrate. When the concentrate is diluted, the dilution factor is not particularly limited and may be determined appropriately in accordance with the concentration of each component in the concentrate, the polishing conditions, or the like.

Specifically, the dilution factor is preferably 1.5 times or more, more preferably 2 times or more, even more preferably 3 times or more, and much more preferably 4 times or more. The dilution factor is preferably 20 times or less, more preferably 15 times or less, even more preferably 10 times or less, and much more preferably 8 times or less. Accordingly, the dilution factor is preferably 1.5 to 20 times, more preferably 2 to 15 times, even more preferably 3 to 10 times, and much more preferably 4 to 8 times.

Examples of the material of the semiconductor substrate include an elementary semiconductor such as Si or Ge, a compound semiconductor such as GaAs, InP, or CdS, and a mixed crystal semiconductor such as InGaAs or HgCdTe.

Examples of the material of the thin film for which the polishing liquid composition of this embodiment is used more suitably include the following materials that are conventionally known as constituting a semiconductor device: a metal such as aluminum, nickel, tungsten, copper, tantalum, or titanium; a semimetal such as silicon; an alloy containing any of these metals as the main component; a glass material such as glass, glassy carbon, or amorphous carbon; a ceramic material such as alumina, silicon dioxide, silicon nitride, tantalum nitride, or titanium nitride; and a resin such as a polyimide resin. In particular, the thin film preferably includes silicon, more preferably includes at least one selected from the group consisting of silicon oxide, silicon nitride, and polysilicon, and even more preferably includes silicon oxide, since such a thin film can be polished favorably with the polishing liquid composition of this embodiment. The silicon oxide may be, e.g., quartz, glass, silicon dioxide, or tetraethoxysilane (TEOS). The thin film including the silicon oxide may be doped with elements such as phosphorus and boron. Specific examples of such a thin film include a BPSG (boro-phospho-silicate glass) film and a PSG (phospho-silicate glass) film. The silicon oxide film doped with these elements is polished more easily than the silicon oxide film that is not doped with the elements. Therefore, the polishing liquid composition needs to include a larger amount of the water-soluble organic compound to facilitate the planarization. However, when the polishing liquid composition includes the water-soluble organic compound in quantity, the composite oxide particles can be aggregated and settled out. In an example of the polishing liquid composition of this embodiment that includes DHEG as the water-soluble organic compound, even if the content of DHEG is, e.g., 0.2 to 20 wt %, the aggregation of the composite oxide particles is suppressed sufficiently, and the dispersion stability is extremely high. Thus, an example of the polishing liquid composition of this embodiment is particularly suitable for the polishing of the BPSG film, the PSG film, or the like.

From the viewpoint of quickly polishing the convex portions and enabling the formation of a polished surface with higher flatness, the method for manufacturing a semiconductor device of this embodiment is useful in the case where the entire uneven surface is composed of the same material.

A difference in level (H) between the mutually adjacent convex and concave portions (see, e.g., FIG. 4A) is preferably 50 to 2000 nm, and more preferably 100 to 1500 nm. The "difference in level (H)" means a distance between the top of the convex portion and the bottom of the concave portion, and can be determined with a profile measuring apparatus (HRP-100 manufactured by KLA-Tencor Corporation).

The material or the like of the polishing pad used in the polishing process is not particularly limited, and any conventionally known materials can be used. Examples of the material of the polishing pad include an organic polymer foam such as a nonwoven fabric or a rigid polyurethane foam and an inorganic foam. In particular, the rigid polyurethane foam is preferred.

From the viewpoint of further improving the polishing rate, the supply rate of the polishing liquid composition is preferably 0.01 g/min or more, more preferably 0.05 g/min or more, and even more preferably 0.1 g/min or more per 1 $cm^2$ of the surface to be polished. From the viewpoint of reducing the cost and facilitating the disposal of liquid wastes, the supply rate of the polishing liquid composition is preferably 10 g/min or less, more preferably 5 g/min or less, and even more preferably 3 g/min or less per 1 $cm^2$ of the uneven surface. Accordingly, the supply rate of the polishing liquid composition is preferably 0.01 to 10 g/min, more preferably 0.05 to 5 g/min, and even more preferably 0.1 to 3 g/min per 1 $cm^2$ of the surface to be polished.

The polishing liquid composition of this embodiment is not limited to a single-liquid type that is put on the market with all the components being mixed beforehand, but can be a two-liquid type including separate components that are to be mixed at the time of use. In the two-liquid type polishing liquid composition, the aqueous medium is divided into a first aqueous medium and a second aqueous medium, and the polishing liquid composition is composed of an aqueous medium composition (I) including the composite oxide particles, the dispersing agent, and the first aqueous medium and an aqueous medium composition (II) including the water-soluble organic compound and the second aqueous medium. The aqueous medium composition (I) also may include part of the water-soluble organic compound other than the composite oxide particles and the dispersing agent. The aqueous medium composition (II) also may include part of the composite oxide particles and part of the dispersing agent other than the water-soluble organic compound. When the water-soluble organic compound is a water-soluble acrylic acid-based polymer, from the viewpoint of facilitating the mixing of the components at the time of use, it is preferable that the aqueous medium composition (I) does not include the water-soluble acrylic acid-based polymer and the aqueous medium composition (II) does not include the composite oxide particles.

The aqueous medium compositions (I) and (II) may be either mixed before they are supplied to the uneven surface or mixed on the uneven surface after they have been supplied separately. The aqueous medium composition (II) (i.e., additive aqueous solution) that includes the water-soluble organic compound and the second aqueous medium and is used with the aqueous medium composition (I) can act as a planarization accelerator during polishing.

Next, the content or the like of each component of an example of the two-liquid type polishing liquid composition will be described. In this example, however, the aqueous medium composition (I) does not include the water-soluble organic compound and the aqueous medium composition (II) does not include the composite oxide particles and the dispersing agent.

The content of each component in the two-liquid type polishing liquid composition may be the same as that of each component in a single-liquid type polishing liquid composition when the aqueous medium compositions (I) and (II) are mixed. For example, the content of the composite oxide particles in the aqueous medium composition (I), the content of the dispersing agent in the aqueous medium composition (I), and the content of the water-soluble organic compound in the aqueous medium composition (II) can be preferably as follows.

From the viewpoint of further improving the polishing rate, the content of the composite oxide particles in the aqueous medium composition (I) is preferably 0.1 wt % or more, more preferably 0.2 wt % or more, even more preferably 0.4 wt % or more, and much more preferably 0.5 wt % or more. From the viewpoint of further improving the dispersion stability and reducing the cost, the content of the composite oxide particles in the aqueous medium composition (I) is preferably 8 wt % or less, more preferably 5 wt % or less, even more preferably 4 wt % or less, and much more preferably 3 wt % or less. Accordingly the content of the composite oxide particles is preferably 0.1 to 8 wt %, more preferably 0.2 to 5 wt %, even more preferably 0.4 to 4 wt %, and much more preferably 0.5 to 3 wt %.

From the viewpoint of further improving the dispersion stability, the content of the dispersing agent in the aqueous medium composition (I) is preferably 0.0005 wt % or more, more preferably 0.001 wt % or more, and even more preferably 0.002 wt % or more. Moreover, the content of the dispersing agent in the aqueous medium composition (I) is preferably 0.5 wt % or less, more preferably 0.1 wt % or less, and even more preferably 0.05 wt % or less. Accordingly, the content of the dispersing agent is preferably 0.0005 to 0.5 wt %, more preferably 0.001 to 0.1 wt %, and even more preferably 0.002 to 0.05 wt %.

From the viewpoint of providing a polished surface with excellent flatness, the content of the water-soluble organic compound in the aqueous medium composition (II) (i.e., additive aqueous solution) is preferably 0.04 to 60 wt %, more preferably 0.1 to 50 wt %, even more preferably 0.2 to 40 wt %, and much more preferably 0.4 to 30 wt %.

From the viewpoint of improving the liquid supply accuracy and providing a uniform mixed solution, the mixing ratio of the aqueous medium composition (I) to the aqueous medium composition (II) (i.e., additive aqueous solution) (weight of aqueous medium composition (I)/weight of aqueous medium composition (II)) is preferably 1/2 to 50/1, more preferably 2/1 to 40/1, even more preferably 5/1 to 30/1, and much more preferably 10/1 to 20/1.

From the viewpoint of further improving the dispersion stability the pH of the aqueous medium composition (I) at 25° C. is preferably 2 to 11, more preferably 3 to 10, even more preferably 4 to 10, and much more preferably 5 to 9.

The preferred pH of the aqueous medium composition (II) at 25° C. varies depending on the type of the water-soluble organic compound and may be determined so that the pH of the polishing liquid composition obtained by mixing the aqueous medium compositions (I) and (II) falls in the preferred pH range as described above. For example, when the water-soluble organic compound is DHEG or ammonium polyacrylate, from the viewpoint of further improving the dispersion stability of the composite oxide particles, the pH of the aqueous medium composition (II) at 25° C. is preferably 3 to 10, more preferably 3 to 8, even more preferably 4 to 7, and much more preferably 4 to 6.

Whether the polishing liquid composition is a single-liquid type or a two-liquid type, from the viewpoint of suppressing the adverse effect on the planarization and the occurrence of scratches caused by an excessive load, the set polishing load of the polishing apparatus provided with the polishing pad is preferably 100 kPa or less, more preferably 70 kPa or less, and even more preferably 50 kPa or less. From the viewpoint of shortening the polishing time, the set polishing load is preferably 5 kPa or more, and more preferably 10 kPa or more. Accordingly, the set polishing load is preferably 5 to 100 kPa, more preferably 10 to 70 kPa, and even more preferably 10 to 50 kPa.

When the polishing pad is a rotating pad, the number of revolutions of the polishing pad is preferably 30 to 200 rpm, more preferably 45 to 150 rpm, and even more preferably 60 to 100 rpm. The number of revolutions of the object to be polished is preferably 30 to 200 rpm, more preferably 45 to 150 rpm, and even more preferably 60 to 100 rpm.

The above polishing process can be applied to any type of polishing during the manufacturing process of the semiconductor device. Specific examples include (1) polishing performed in the process of forming a buried isolation film, (2) polishing performed in the process of flattening an interlayer insulating film, (3) polishing performed in the process of forming buried metal wiring (damascene interconnect etc.), and (4) polishing performed in the process of forming a buried capacitor. In particular, the polishing process in the manufacturing method of the semiconductor device of this embodiment is preferably applied to (1) and (2).

The manufacturing method of the semiconductor device of this embodiment may include a cleaning process, a heat-treatment process, an impurity diffusion process, or the like as needed.

Examples of the semiconductor device include a memory IC (integrated circuit), a logic IC, and system LSI (large-scale integration).

The polishing liquid composition of this embodiment is used, e.g., to polish the oxide film 3 in the process of forming a buried isolation film during the manufacturing process of the semiconductor device, as described with reference to FIGS. 1A to 1D in Embodiment 1. Moreover, the polishing liquid composition of this embodiment is used, e.g., to polish the oxide film 21 in the process of flattening an interlayer insulating film during the manufacturing process of the semiconductor device, as described with reference to FIGS. 2A to 3B in Embodiment 1.

As described above, this embodiment can provide a polishing liquid composition capable of forming a polished surface with high flatness by polishing in a short time, a polishing method using this polishing liquid composition, and a method for manufacturing a semiconductor device.

EXAMPLES

<Object to be Polished>

1. Base Material of Aluminosilicate Glass Substrate Used for Hard Disk

A base material of an aluminosilicate glass substrate (referred to as a "glass base material" in the following) used for a hard disk was prepared. This glass base material was polished beforehand with a polishing liquid composition including ceria particles as a polishing agent. The surface roughness of the glass base material was 0.3 nm (AFM-Ra), the thickness was 0.635 mm, the outer diameter was 65 mm, and the inner diameter was 20 mm.

2. Synthetic Quartz Wafer

A synthetic quartz wafer (manufactured by Optostar Ltd.) having two lapped principal surfaces, a diameter of 5.08 cm (2 inches), and a thickness of 1.0 mm was prepared.

3. Silicon Wafer Provided with TEOS (Tetraethoxysilane) Film

A 2000 nm thick TEOS film was formed on a silicon wafer with a diameter of 20.32 cm (8 inches) by a parallel-plate plasma chemical vapor deposition (p-CVD) method.

4. Silicon Wafer Provided with Thermal Oxide Film

A 2000 nm thick silicon dioxide film was formed on a silicon wafer with a diameter of 20.32 cm (8 inches). The silicon dioxide film was obtained by exposing the silicon wafer to an oxygen gas or steam in an oxidation furnace so that silicon in the silicon wafer was allowed to react with oxygen.

5. Silicon Wafer Provided with HDP Film

A 1000 nm thick silicon oxide film was formed on a silicon wafer with a diameter of 20.32 cm (8 inches) by a high-density plasma chemical vapor deposition (HDP-CVD) method.

<Polishing Conditions>

1. Polishing of Glass Base Material or Synthetic Quartz Wafer

Polishing test machine: a single-sided polishing machine MA-300 with a platen diameter of 300 mm manufactured by Musashino Electronic Co., Ltd.

Polishing pad: a laminated pad of IC1000 (hard urethane pad) and suba400 (nonwoven fabric pad) manufactured by NITTA HAAS INCORPORATED or NP025 (suede-type pad) manufactured by FILWEL CO., LTD.

Number of revolutions of platen: 90 r/min

Number of revolutions of carrier: 90 r/min (a forced drive system)

Supply rate of polishing liquid composition: 50 g/min (about 1.5 mL/min/cm$^2$)

Polishing time: 15 min

Polishing load: 300 g/cm$^2$ (a constant load applied by a weight)

Dress conditions: A brush was dressed by supplying ion-exchanged water to the brush for 1 minute before polishing.

2. Polishing of TEOS Film, Thermal Oxide Film, or HDP Film

Polishing test machine: a single-sided polishing machine LP-541 with a platen diameter of 540 mm manufactured by Lapmaster SFT Corp.

Polishing pad: a laminated pad of IC1000 (hard urethane pad) and suba400 (nonwoven fabric pad) manufactured by NITTA HAAS INCORPORATED Number of revolutions of platen: 100 rpm Number of revolutions of head: 110 rpm (the rotation direction is the same as that of the platen)

Polishing time: 1 min

Polishing load: 30 kPa (a set value)

Supply of polishing liquid composition: 200 ml/min

<Evaluation Method>

Using the polishing liquid compositions of Examples 1 to 20 and Comparative Examples 1 to 14 (see Tables 1 to 3), the objects to be polished were polished, and then cleaned with running ion-exchanged water. Subsequently, the objects to be polished were immersed in ion-exchanged water and ultrasonically cleaned (at 100 kHz for 3 minutes). Further, the objects to be polished were cleaned with running ion-exchanged water, and finally dried by spin drying.

(Preparation of Abrasive Slurry)

(1) $Ce_{0.75}Zr_{0.25}O_2$ Particle Slurry

A calcined product A ($Ce_{0.75}Zr_{0.25}O_2$ particles) was wet-pulverized in water containing a dispersing agent (ammonium polyacrylate with a weight average molecular weight of 6000) using a bead mill, thereby providing a $Ce_{0.75}Zr_{0.25}O_2$ particle slurry ($Ce_{0.75}Zr_{0.25}O_2$ particles: 25 wt %) with a volume median diameter of 150 nm. The calcined product A was obtained by calcining uncalcined $Ce_{0.75}Zr_{0.25}O_2$ particles (ACTALYS 9320 manufactured by Rhodia Japan, Ltd.) at 1160° C. for 6 hours in a continuous kiln. The cerium (IV) compound and the zirconium (IV) compound were used as materials for the calcined product A.

(2) $CeO_2$ Particle Slurry

A calcined product, i.e., $CeO_2$ particles (with a purity of 99.9% manufactured by Baikowski Japan Co., Ltd.) were wet-pulverized in water containing a dispersing agent (ammonium polyacrylate with a weight average molecular weight of 6000) using a bead mill, thereby providing a $CeO_2$ particle slurry ($CeO_2$ particles: 40 wt %) with a volume median diameter of 130 nm. The cerium (IV) compound was used as a material for the $CeO_2$ particles.

(3) $Ce_{0.87}Zr_{0.13}O_2$ Particle Slurry

A calcined product B ($Ce_{0.87}Zr_{0.13}O_2$ particles) was wet-pulverized in water containing a dispersing agent (ammonium polyacrylate with a weight average molecular weight of 6000) using a bead mill, thereby providing a $Ce_{0.87}Zr_{0.13}O_2$ particle slurry ($Ce_{0.87}Zr_{0.13}O_2$ particles: 25 wt %) with a volume median diameter of 150 nm. The calcined product B was obtained by calcining uncalcined $Ce_{0.87}Zr_{0.13}O_2$ particles (manufactured by Rhodia Japan, Ltd.) at 1100° C. for 6 hours in a continuous kiln. The cerium (IV) compound and the zirconium (IV) compound were used as materials for the calcined product B.

(4) $Ce_{0.80}Zr_{0.20}O_2$ Particle Slurry

A calcined product C ($Ce_{0.80}Zr_{0.20}O_2$ particles) was wet-pulverized in water containing a dispersing agent (ammonium polyacrylate with a weight average molecular weight of 6000) using a bead mill, thereby providing a $Ce_{0.80}Zr_{0.20}O_2$ particle slurry ($Ce_{0.80}Zr_{0.20}O_2$ particles: 25 wt %) with a volume median diameter of 150 nm. The calcined product C was obtained by calcining uncalcined $Ce_{0.80}Zr_{0.20}O_2$ particles (ACTALYS 9315 manufactured by Rhodia Japan, Ltd.) at 1160° C. for 6 hours in a continuous kiln. The cerium (IV) compound and the zirconium (IV) compound were used as materials for the calcined product C.

(5) $Ce_{0.62}Zr_{0.38}O_2$ Particle Slurry

A calcined product D ($Ce_{0.62}Zr_{0.38}O_2$ particles) was wet-pulverized in water containing a dispersing agent (ammonium polyacrylate with a weight average molecular weight of 6000) using a bead mill, thereby providing a $Ce_{0.62}Zr_{0.38}O_2$ particle slurry ($Ce_{0.62}Zr_{0.38}O_2$ particles: 25 wt %) with a volume median diameter of 150 nm. The calcined product D was obtained by calcining uncalcined $Ce_{0.62}Zr_{0.38}O_2$ particles (ACTALYS 9330 manufactured by Rhodia Japan, Ltd.) at 1240° C. for 6 hours in a continuous kiln. The cerium (IV) compound and the zirconium (IV) compound were used as materials for the calcined product D.

(6) Uncalcined $Ce_{0.80}Zr_{0.20}O_2$ Particle Slurry

Uncalcined $Ce_{0.80}Zr_{0.20}O_2$ particles (ACTALYS 9315 manufactured by Rhodia Japan, Ltd.) were wet-pulverized in water containing a dispersing agent (ammonium polyacrylate with a weight average molecular weight of 6000) using a bead mill, thereby providing an uncalcined $Ce_{0.80}Zr_{0.20}O_2$ particle slurry ($Ce_{0.80}Zr_{0.20}O_2$ particles: 25 wt %) with a volume median diameter of 150 nm. The cerium (IV) compound and the zirconium (IV) compound were used as materials for the uncalcined $Ce_{0.80}Zr_{0.20}O_2$ particles.

(7) Uncalcined $Ce_{0.62}Zr_{0.38}O_2$ Particle Slurry

Uncalcined $Ce_{0.62}Zr_{0.38}O_2$ particles (ACTALYS 9330 manufactured by Rhodia Japan, Ltd.) were wet-pulverized in water containing a dispersing agent (ammonium polyacrylate with a weight average molecular weight of 6000) using a bead mill, thereby providing an uncalcined $Ce_{0.62}Zr_{0.38}O_2$ particle slurry ($Ce_{0.62}Zr_{0.38}O_2$ particles: 25 wt %) with a volume median diameter of 150 nm. The cerium (IV) compound and the zirconium (IV) compound were used as materials for the uncalcined $Ce_{0.62}Zr_{0.38}O_2$ particles.

(8) $Ce_{0.74}Zr_{0.26}O_2$ Particle Slurry

A calcined product E ($Ce_{0.74}Zr_{0.26}O_2$ particles) was wet-pulverized in water containing a dispersing agent (ammonium polyacrylate with a weight average molecular weight of 6000) using a bead mill, thereby providing a $Ce_{0.74}Zr_{0.26}O_2$ particle slurry ($Ce_{0.74}Zr_{0.26}O_2$ particles: 25 wt %) with a volume median diameter of 150 nm. The cerium (III) compound and the zirconium (IV) compound were used as materials for the calcined product E.

The following is a detailed explanation of the method for preparing the $Ce_{0.74}Zr_{0.26}O_2$ particle slurry.

First, 4280 g of 37.7 wt % cerium (III) nitrate solution and 1070 g of 54.8 wt % zirconium (IV) nitrate solution were stirred and mixed in a 30 L reactor. The pH of the resultant mixed solution was 1.26. Then, 10 L of deionized water was added to the mixed solution.

Next, 3.8 mol/L ammonia water was added continuously at a supply rate of 1.7 L/hr to the mixed solution to which the deionized water had been added. When the pH of this mixed solution reached 7.2, 1148 ml of 5.8 mol/L hydrogen peroxide solution was added, and further ammonia water was added continuously to stabilize the pH, so that a coprecipitate of cerium hydroxide and zirconium hydroxide was obtained.

The total amount of ammonia water added was 2420 ml and the total amount of hydrogen peroxide solution (5.8 M) added was 1148 ml.

Then, the coprecipitate was filtered out using filter paper and cleaned with deionized water. After calcining the cleaned product at 1130° C. for 2 hours, coarse particles were removed from the calcined product using a 60-mesh filter. Subsequently, the calcined product E from which the coarse particles had been removed by screening was wet-pulverized, and then filtered out using a pleated filter with a filtration accuracy of 2 μm. Thus, the $Ce_{0.74}Zr_{0.26}O_2$ particle slurry was provided.

(Preparation of Polishing Liquid Composition)

The polishing liquid compositions were produced by mixing each of the slurries as prepared in the above manner, water, and nitric acid as a pH adjuster so that the abrasive grains, the dispersing agent, and the water and pH adjuster were present in concentrations as shown in Tables 1 to 3.

TABLE 1

| | Slurry No. | Composition of polishing liquid composition | wt % | | Object to be polished | pH | Polishing rate nm/min | Polishing pad |
|---|---|---|---|---|---|---|---|---|
| Ex. 1 | (1) | $Ce_{0.75}Zr_{0.25}O_2$<br>Dispersing agent<br>Water and pH adjuster | 1<br>0.0025<br>Residual | 100 | Glass base material | 6.3 | 454 | Laminated pad※ |
| Comp. Ex. 1 | (2) | $CeO_2$<br>Dispersing agent<br>Water and pH adjuster | 1<br>0.0025<br>Residual | 100 | | 6.0 | 344 | |
| Ex. 2 | (1) | $Ce_{0.75}Zr_{0.25}O_2$<br>Dispersing agent<br>Water and pH adjuster | 5<br>0.0125<br>Residual | 100 | | 6.3 | 1688 | |
| Comp. Ex. 2 | (2) | $CeO_2$<br>Dispersing agent<br>Water and pH adjuster | 5<br>0.0125<br>Residual | 100 | | 6.3 | 834 | |
| Ex. 3 | (1) | $Ce_{0.75}Zr_{0.25}O_2$<br>Dispersing agent<br>Water and pH adjuster | 1<br>0.0025<br>Residual | 100 | Glass base material | 6.3 | 237 | NP025 |
| Comp. Ex. 3 | (2) | $CeO_2$<br>Dispersing agent<br>Water and pH adjuster | 1<br>0.0025<br>Residual | 100 | | 6.0 | 155 | |
| Ex. 4 | (3) | $Ce_{0.87}Zr_{0.13}O_2$<br>Dispersing agent<br>Water and pH adjuster | 5<br>0.0125<br>Residual | 100 | | 6.1 | 196 | |
| Ex. 5 | (4) | $Ce_{0.80}Zr_{0.20}O_2$<br>Dispersing agent<br>Water and pH adjuster | 5<br>0.0125<br>Residual | 100 | | 6.2 | 216 | |
| Ex. 6 | (1) | $Ce_{0.75}Zr_{0.25}O_2$<br>Dispersing agent<br>Water and pH adjuster | 5<br>0.0125<br>Residual | 100 | | 6.2 | 207 | |
| Ex. 7 | (5) | $Ce_{0.62}Zr_{0.38}O_2$<br>Dispersing agent<br>Water and pH adjuster | 5<br>0.0125<br>Residual | 100 | | 6.3 | 172 | |
| Comp. Ex. 4 | (2) | $CeO_2$<br>Dispersing agent<br>Water and pH adjuster | 5<br>0.0125<br>Residual | 100 | | 6.3 | 167 | |
| Ex. 8 | (1) | $Ce_{0.75}Zr_{0.25}O_2$<br>Dispersing agent<br>Water and pH adjuster | 1<br>0.0025<br>Residual | 100 | Synthetic quartz wafer | 6.3 | 88 | Laminated pad※ |
| Comp. Ex. 5 | (2) | $CeO_2$<br>Dispersing agent<br>Water and pH adjuster | 1<br>0.0025<br>Residual | 100 | | 6.0 | 34 | |
| Ex. 9 | (1) | $Ce_{0.75}Zr_{0.25}O_2$<br>Dispersing agent<br>Water and pH adjuster | 5<br>0.0125<br>Residual | 100 | | 6.3 | 1472 | |
| Comp. Ex. 6 | (2) | $CeO_2$<br>Dispersing agent<br>Water and pH adjuster | 5<br>0.0125<br>Residual | 100 | | 6.3 | 320 | |

※:Laminated pad of IC1000 and suba400

TABLE 2

| | Slurry No. | Composition of polishing liquid composition | wt % | | Object to be polished | pH | Polishing rate nm/min | Polishing pad |
|---|---|---|---|---|---|---|---|---|
| Ex. 10 | (1) | $Ce_{0.75}Zr_{0.25}O_2$<br>Dispersing agent<br>Water and pH adjuster | 1<br>0.0025<br>Residual | 100 | Synthetic quartz wafer | 6.3 | 117 | NP025 |
| Comp. Ex. 7 | (2) | $CeO_2$<br>Dispersing agent<br>Water and pH adjuster | 1<br>0.0025<br>Residual | 100 | | 6.0 | 71 | |
| Ex. 11 | (3) | $Ce_{0.87}Zr_{0.13}O_2$<br>Dispersing agent<br>Water and pH adjuster | 5<br>0.0125<br>Residual | 100 | | 6.1 | 798 | |

TABLE 2-continued

| | Slurry No. | Composition of polishing liquid composition | wt % | Object to be polished | pH | Polishing rate nm/min | Polishing pad |
|---|---|---|---|---|---|---|---|
| Ex. 12 | (4) | $Ce_{0.80}Zr_{0.20}O_2$<br>Dispersing agent<br>Water and pH adjuster | 5<br>0.0125<br>Residual | 100 | 6.2 | 874 | |
| Ex. 13 | (1) | $Ce_{0.75}Zr_{0.25}O_2$<br>Dispersing agent<br>Water and pH adjuster | 5<br>0.0125<br>Residual | 100 | 6.3 | 562 | |
| Ex. 14 | (5) | $Ce_{0.62}Zr_{0.38}O_2$<br>Dispersing agent<br>Water and pH adjuster | 5<br>0.0125<br>Residual | 100 | 6.3 | 787 | |
| Comp. Ex. 8 | (2) | $CeO_2$<br>Dispersing agent<br>Water and pH adjuster | 5<br>0.0125<br>Residual | 100 | 6.3 | 496 | |
| Ex. 15 | (1) | $Ce_{0.75}Zr_{0.25}O_2$<br>Dispersing agent<br>Water and pH adjuster | 1<br>0.0025<br>Residual | 100 TEOS film | 6.3 | 650 | Laminated pad※ |
| Comp. Ex. 9 | (2) | $CeO_2$<br>Dispersing agent<br>Water and pH adjuster | 1<br>0.0025<br>Residual | 100 | 6.0 | 365 | |
| Ex. 20 | (1) | $Ce_{0.75}Zr_{0.25}O_2$<br>Dispersing agent<br>Water and pH adjuster | 1<br>0.0025<br>Residual | 100 HDP film | 6.3 | 725 | Laminated pad※ |
| Comp. Ex. 14 | (2) | $CeO_2$<br>Dispersing agent<br>Water and pH adjuster | 1<br>0.0025<br>Residual | 100 | 6.0 | 400 | |

※Laminated pad of IC1000 and suba400

TABLE 3

| | Slurry No. | Composition of polishing liquid composition | wt % | Object to be polished | pH | Polishing rate nm/min | Polishing pad | Number of scratches |
|---|---|---|---|---|---|---|---|---|
| Comp. Ex. 10 | (2) | $CeO_2$<br>Dispersing agent<br>Water and pH adjuster | 1<br>0.0025<br>Residual | 100 Thermal oxide film | 6.0 | 410 | Laminated pad※ | 12 |
| Ex. 16 | (3) | $Ce_{0.87}Zr_{0.13}O_2$<br>Dispersing agent<br>Water and pH adjuster | 1<br>0.0025<br>Residual | 100 | 6.1 | 504 | | 4 |
| Ex. 17 | (4) | $Ce_{0.80}Zr_{0.20}O_2$<br>Dispersing agent<br>Water and pH adjuster | 1<br>0.0025<br>Residual | 100 | 6.2 | 554 | | — |
| Ex. 18 | (1) | $Ce_{0.75}Zr_{0.25}O_2$<br>Dispersing agent<br>Water and pH adjuster | 1<br>0.0025<br>Residual | 100 | 6.3 | 665 | | 3 |
| Ex. 19 | (5) | $Ce_{0.62}Zr_{0.38}O_2$<br>Dispersing agent<br>Water and pH adjuster | 1<br>0.0025<br>Residual | 100 | 6.2 | 538 | | 8 |
| Comp. Ex. 11 | (6) | $Ce_{0.80}Zr_{0.20}O_2$<br>Dispersing agent<br>Water and pH adjuster | 1<br>0.0025<br>Residual | 100 | 6.1 | 101 | | — |
| Comp. Ex. 12 | (7) | $Ce_{0.62}Zr_{0.38}O_2$<br>Dispersing agent<br>Water and pH adjuster | 1<br>0.0025<br>Residual | 100 | 6.1 | 76 | | — |
| Comp. Ex. 13 | (8) | $Ce_{0.74}Zr_{0.26}O_2$<br>Dispersing agent<br>Water and pH adjuster | 1<br>0.025<br>Residual | 100 | 6.0 | 604 | | 300 or more |

※Laminated pad of IC 1000 and suba400

20 g of each slurry was dried in an atmosphere at 110° C. for 12 hours, and then the dried product was crushed in a mortar to provide a sample for powder X-ray diffraction. Table 4 shows the results of the analysis of each sample by the powder X-ray diffraction method. The measurement conditions of the powder X-ray diffraction method were as follows.

(Measurement Conditions)

Apparatus: a powder X-ray diffractometer RINT2500VC manufactured by Rigaku Corporation X-ray generation voltage: 40 kV Radiation: Cu—Kα1 ray ($\lambda$=0.154050 nm)

Current: 120 mA

Scan speed: 10 degree/min

Measurement step: 0.02 degree/min

TABLE 4

| Slurry No. | Composition of abrasive grains | First peak (2θ) | Second peak (2θ) | Third peak (2θ) | Fourth peak (2θ) | Peak a$_1$ (2θ) | Peak a$_2$ (2θ) | (peak a$_1$/first peak) × 100(%) | (peak a$_2$/first peak) × 100(%) | Half-width of first peak | Volume median diameter (nm) |
|---|---|---|---|---|---|---|---|---|---|---|---|
| (1) | Ce$_{0.75}$Zr$_{0.25}$O$_2$ | 28.870° 100.0 | 33.471° 27.0 | 48.049° 49.5 | 57.012° 37.3 | — | — | 0 | 0 | 0.330° | 150 |
| (2) | CeO$_2$ | 28.549° 100.0 | 33.077° 28.1 | 47.483° 52.7 | 56.342° 39.6 | — | — | 0 | 0 | 0.330° | 130 |
| (3) | Ce$_{0.87}$Zr$_{0.13}$O$_2$ | 28.729° 100.0 | 33.293° 27.5 | 47.824° 53.2 | 56.762° 39.6 | — | — | 0 | 0 | 0.347° | 150 |
| (4) | Ce$_{0.80}$Zr$_{0.20}$O$_2$ | 28.823° 100.0 | 33.406° 27.3 | 47.986° 51.6 | 56.928° 38.1 | — | — | 0 | 0 | 0.300° | 150 |
| (5) | Ce$_{0.62}$Zr$_{0.38}$O$_2$ | 28.911° 100.0 | 33.467° 24.5 | 48.143° 49.0 | 57.084° 30.5 | — | 29.813° 5.7 | 0 | 5.7 | 0.418° | 150 |
| (6) | Ce$_{0.80}$Zr$_{0.20}$O$_2$ (uncalcined) | 28.820° 100.0 | 33.500° 23.4 | 47.960° 43.4 | 57.060° 27.7 | — | — | 0 | 0 | 1.052° | 150 |
| (7) | Ce$_{0.62}$Zr$_{0.38}$O$_2$ (uncalcined) | 29.080° 100.0 | 33.620° 23.7 | 48.740° 30.3 | 57.340° 25.0 | — | — | 0 | 0 | 0.991° | 150 |
| (8) | Ce$_{0.74}$Zr$_{0.26}$O$_2$ | 28.731° 100.0 | 33.273° 36.1 | 47.752° 74.1 | 56.717° 18.5 | — | 29.831° 6.4 | 0 | 6.4 | 0.401° | 150 |

Upper row: diffraction angle 2θ (each indicating the value of a peak top)
Lower row: peak area ratio (relative intensity when the first peak is defined as 100)
(peak a$_1$/first peak) × 100 (%) indicates (height of peak top of peak a$_1$/height of peak top of first peak) × 100 (%)
(peak a$_2$/first peak) × 100 (%) indicates (height of peak top of peak a$_2$/height of peak top of first peak) × 100 (%)

The height of the peak top of each peak, the half-width of the first peak, and the area of each peak were calculated from the measured powder X-ray diffraction spectrum using powder X-ray diffraction pattern integrated analysis software JADE (manufactured by MDI (Materials Data, Inc.)) that was included in the powder X-ray diffractometer. The calculation with this software was based on its instruction manual (Jade (Ver. 5) Software, Manual No. MJ13133E02, Rigaku Corporation).

When the peak derived from the cerium oxide and/or the peak derived from the zirconium oxide are present in the spectrum as shoulder peaks of the peak derived from the composite oxide, e.g., the above software can separate the peaks and determine the height of the peak top and the area of each peak.

<Calculation Method of Polishing Rate>
1. Glass Base Material and Synthetic Quartz Wafer First, a weight difference (g) of the object to be polished before and after polishing was determined. Then, the polishing amount per unit time was obtained by dividing the weight difference (g) by the density of the object to be polished (the glass base material: 2.46 g/cm$^3$ and the synthetic quartz wafer: 2.20 g/cm$^3$), the area of the surface of the object to be polished (the glass base material: 30.04 cm$^2$ and the synthetic quartz wafer: 19.63 cm$^2$), and the polishing time (min), so that the polishing rate (nm/min) was calculated.

2. TEOS Film, Thermal Oxide Film, and HDP Film

The thicknesses of the TEOS film before and after polishing were measured with a spectrometric film thickness measurement system (VM-1000 manufactured by DAINIPPON SCREEN MFG. CO., LTD.). The polishing rate was calculated from these values as expressed by the following equation. The polishing rate of the thermal oxide film or the HDP film also was determined in the same manner.

Polishing rate(nm/min)=(film thickness before polishing)−(film thickness after polishing)

<Evaluation Method of Number of Scratches>
Object to be polished: a silicon wafer provided with a thermal oxide film A 1000 nm thick silicon dioxide film was formed on a silicon wafer with a diameter of 5 cm (2 inches). The silicon dioxide film was obtained by exposing the silicon wafer to an oxygen gas or steam in an oxidation furnace so that silicon in the silicon wafer was allowed to react with oxygen.

(Polishing Conditions)
Polishing test machine: a single-sided polishing machine MA-300 with a platen diameter of 300 mm manufactured by Musashino Electronic Co., Ltd.
Polishing pad: a laminated pad of IC1000 (hard urethane pad) and suba400 (nonwoven fabric pad) manufactured by NITTA HAAS INCORPORATED
Number of revolutions of platen: 90 r/min
Number of revolutions of carrier: 90 r/min (a forced drive system)
Supply rate of polishing liquid composition: 50 g/min (about 1.5 mL/min/cm$^2$)
Polishing time: 1 min
Polishing load: 300 g/cm$^2$ (a constant load applied by a weight)
Dress conditions: A brush was dressed with a diamond ring by supplying ion-exchanged water to the brush for 1 minute before polishing.

The objects to be polished were polished with each of the polishing liquid compositions under the above polishing conditions, and the number of scratches was measured by the following method. The number of samples was 3. Table 3 shows the average of the number of scratches observed on each of the polished objects.

In this case, a scratch is a flaw that has approximately a width of 20 nm or more, a length of 50 μm or more, and a depth of 3 nm or more and can be observed with MicroMax VMX-2100.

[Measurement Method of Number of Scratches]
Measurement equipment: MicroMax VMX-2100 manufactured by VISION PSYTEC CO., LTD.
(MicroMax Measurement Conditions)
Light source: 2Sλ (250 W) and 3Pλ (250 W) (the amount of light: 100% for both light sources)
Tilt angle: −9°
Magnification: maximum (the range of field of view: 1/35 of the entire area of the polished surface)
Observed range: the entire area of the polished surface (the 2 inch diameter wafer substrate provided with a thermal oxide film)
Iris: notch Tables 1 to 3 show the polishing rates of polishing with each of the polishing liquid compositions of Examples 1 to 20 and Comparative Examples 1 to 14. As shown in Tables 1 to 3, comparing the example and the comparative example having the same concentration of the abrasive grains, it was confirmed that the polishing rate was higher with the use of the polishing liquid compositions of the examples than with the use of those of the comparative examples, regardless of whether the glass base material, the synthetic quartz wafer, the TEOS film, the thermal oxide film, or the HDP film was polished.

As shown in Tables 3 and 4, when the thermal oxide film was polished, it was confirmed that the number of scratches could be significantly reduced with the use of the polishing liquid composition including the composite oxide particles in which both of (height of peak top of peak $a_1$/height of peak top of first peak)×100 and (height of peak top of peak $a_2$/height of peak top of first peak)×100 were 6.0% or less, compared to the polishing liquid composition including the composite oxide particles in which at least one of (height of peak top of peak $a_1$/height of peak top of first peak)×100 and (height of peak top of peak $a_2$/height of peak top of first peak)×100 was more than 6.0%.

Example 21

A polishing liquid composition was prepared to have the composition as shown in Table 5 in the following manner. First, DHEG (CHELEST GA manufactured by CHELEST CORPORATION) was mixed with ion-exchanged water. Then, the $Ce_{0.87}Zr_{0.13}O_2$ particle slurry was added to the resultant mixed solution while stirring the mixed solution. Moreover, the pH of this mixed solution was adjusted to 6.2 with a 10% ammonia aqueous solution. Thus, the polishing liquid composition was prepared.

Examples 22 to 24

Polishing liquid compositions were prepared to have the compositions as shown in Table 5 in the same manner as Example 21 except that the $Ce_{0.80}Zr_{0.20}O_2$ particle slurry, the $Ce_{0.75}Zr_{0.25}O_2$ particle slurry, or the $Ce_{0.62}Zr_{0.38}O_2$ particle slurry was used instead of the $Ce_{0.87}Zr_{0.13}O_2$ particle slurry.

Example 25

A polishing liquid composition was prepared to have the composition as shown in Table 5 in the following manner. First, EDTA•2NH$_4$ (manufactured by DOJINDO LABORATORIES) was mixed with ion-exchanged water. Then, the $Ce_{0.75}Zr_{0.25}O_2$ particle slurry was added to the resultant mixed solution while stirring the mixed solution. Moreover, the pH of this mixed solution was adjusted to 6.2 with a 10% ammonia aqueous solution. Thus, the polishing liquid composition was prepared.

Example 26

A polishing liquid composition was prepared to have the composition as shown in Table 5 in the following manner. First, L-aspartic acid (manufactured by Wako Pure Chemical Industries, Ltd.) was mixed with ion-exchanged water. Then, 10% ammonia water was added to the resultant mixed solution while stirring the mixed solution, so that the L-aspartic acid was dissolved. Moreover, the $Ce_{0.75}Zr_{0.25}O_2$ particle slurry was added, and finally the pH of this mixed solution was adjusted to 6.0 with 10% ammonia water. Thus, the polishing liquid composition was prepared.

Comparative Example 15

A polishing liquid composition as shown in Table 5 was prepared in the same manner as Example 21 except that the $CeO_2$ particle slurry was used instead of the $Ce_{0.87}Zr_{0.13}O_2$ particle slurry and the content of DHEG (CHELEST GA manufactured by CHELEST CORPORATION) was changed.

Reference Example 1

A polishing liquid composition having the composition as shown in Table 5 was prepared in the same manner as Example 21. The $Ce_{0.75}Zr_{0.25}O_2$ particle slurry was added to ion-exchanged water while stirring the ion-exchanged water. Moreover, the pH of this mixed solution was adjusted to 6.2 with 1% nitric acid. Thus, the polishing liquid composition was prepared.

TABLE 5

|  | Ex. 21 (wt %) | Ex. 22 (wt %) | Ex. 23 (wt %) | Ex. 24 (wt %) | Ex. 25 (wt %) | Ex. 26 (wt %) | Comp. Ex. 15 (wt %) | Ref. Ex. 1 (wt %) |
|---|---|---|---|---|---|---|---|---|
| $Ce_{0.87}Zr_{0.13}O_2$ particles | 1.0 | — | — | — | — | — | — | — |
| $Ce_{0.80}Zr_{0.20}O_2$ particles | — | 1.0 | — | — | — | — | — | — |
| $Ce_{0.75}Zr_{0.25}O_2$ particles | — | — | 1.0 | — | 1.0 | 1.0 | — | 1.0 |
| $Ce_{0.62}Zr_{0.38}O_2$ particles | — | — | — | 1.0 | — | — | — | — |
| $CeO_2$ particles | — | — | — | — | — | — | 1.0 | — |
| DHEG | 1.6 | 1.5 | 1.5 | 1.3 | — | — | 1.3 | — |
| EDTA | — | — | — | — | 0.22 | — | — | — |
| L-aspartic acid | — | — | — | — | — | 0.9 | — | — |
| Dispersing agent[X1] | 0.0025 | 0.0025 | 0.0025 | 0.0025 | 0.0025 | 0.0025 | 0.0025 | 0.0025 |
| Ion-exchanged water and pH adjuster | Residual | Residual | Residual | Residual | Residual | Residual | Residual | Residual |
| Total | 100.0 | 100.0 | 100.0 | 100.0 | 100.0 | 100.0 | 100.0 | 100.0 |

[X1] Ammonium polyacrylate added during the preparation of composite oxide particle slurry (Evaluation Sample)

Figure 4A:
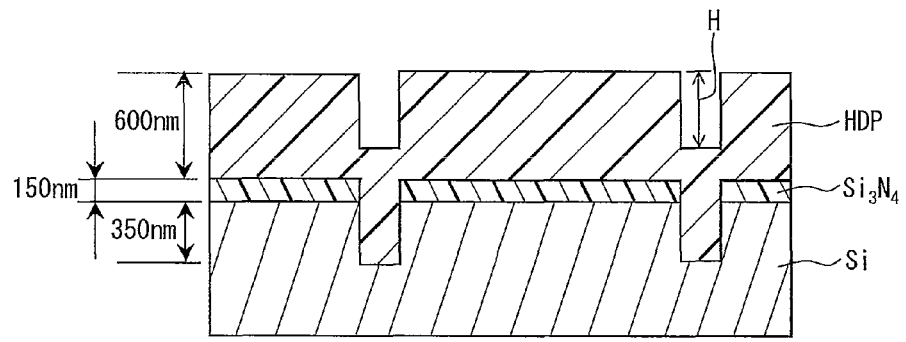
FIG. 4A is a partially enlarged cross-sectional view of an evaluation sample used in Examples of the present invention.
Figure 4B:
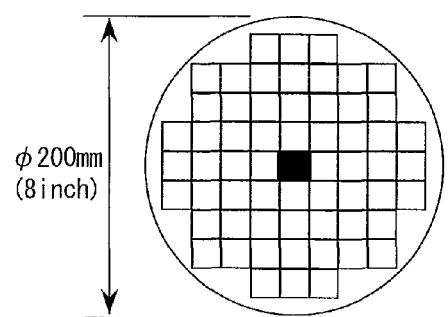
FIG. 4B is a plan view of an evaluation sample used in Examples of the present invention.
Figure 4C:
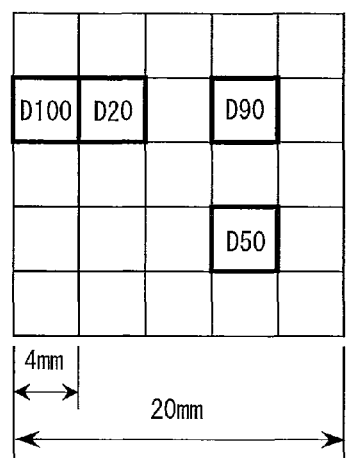
FIG. 4C is an enlarged view of a portion shown in FIG. 4B.
Figure 5A:
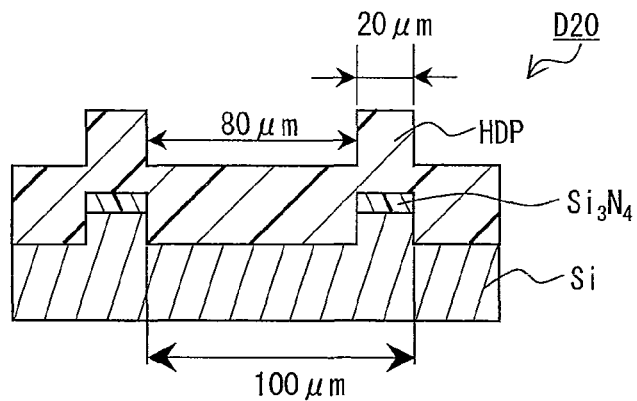
FIG. 5A is a partially enlarged cross-sectional view of an evaluation sample used in Examples of the present invention.
Figure 5B:
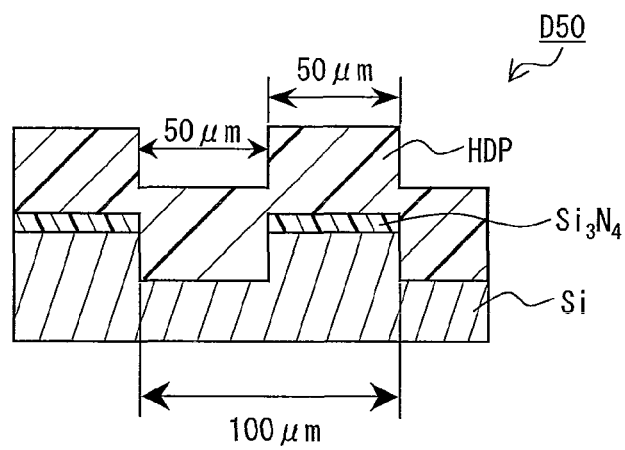
FIG. 5B is a partially enlarged cross-sectional view of an evaluation sample used in Examples of the present invention.
Figure 5C:
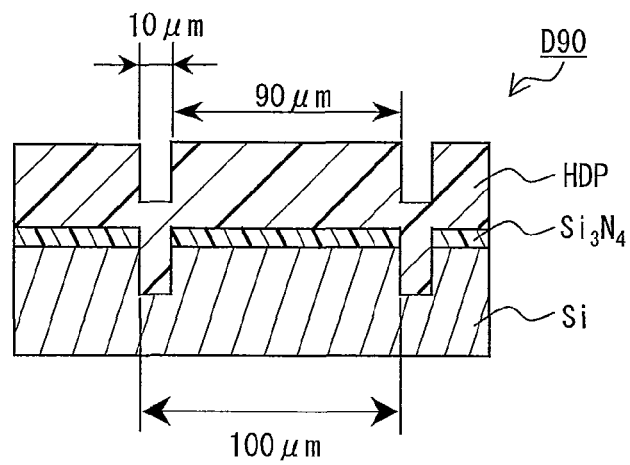
FIG. 5C is a partially enlarged cross-sectional view of an evaluation sample used in Examples of the present invention.
Figure 5D:
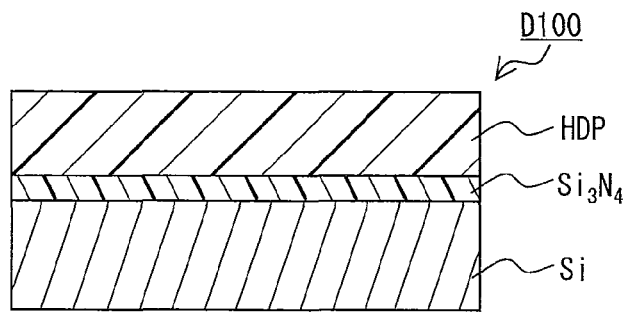
FIG. 5D is a partially enlarged cross-sectional view of an evaluation sample used in Examples of the present invention.

As an evaluation sample, a commercially available wafer for evaluating the CMP characteristics (STI MIT 864 with a diameter of 200 mm) was prepared. This evaluation sample will be described with reference to FIGS. 4A to 4C and 5A to 5D. FIGS. 4A and 5A to 5D are partially enlarged cross-sectional views of the evaluation sample. FIG. 4B is a top view of the evaluation sample and FIG. 4C is a partially enlarged view of FIG. 4B. As shown in FIG. 4A, the evaluation sample includes a silicon substrate and a silicon nitride film (referred to as a "$Si_3N_4$ film" in the following) with a thickness of 150 nm disposed on the silicon substrate. The $Si_3N_4$ film is formed by the CVD method. This laminate has grooves having a depth of 500 nm (150 nm+350 nm). A silicon oxide film (referred to as a "HDP film" in the following) with a thickness of 600 nm is disposed on the $Si_3N_4$ film. The HDP film is formed by the HDP-CVD (high-density plasma chemical vapor deposition) method. As shown in FIG. 4B, the plane of the HDP film is divided into 61 regions (20 mm×20 mm), and each of the regions is further divided into 25 small regions (4 mm×4 mm) (FIG. 4C). In FIG. 4B, the solid black region (referred to as a "center" in the following) is where the thickness is measured, as will be described later. In FIG. 4C, each of the numbers 20, 50, 90, and 100 of D20, D50, D90, and D100 indicates the proportion of the entire area of the convex portions to the area of the small region shown in a plan view (i.e., the surface density of the convex portion). FIGS. 5A to 5D are partially enlarged cross-sectional views of these small regions. As shown in each of the drawings, D20 (FIG. 5A) includes a linear concavo-convex pattern of a convex portion with a width of 20 μm and a concave portion with a width of 80 μm. D50 (FIG. 5B) includes a linear concavo-convex pattern of a convex portion with a width of 50 μm and a concave portion with a width of 50 μm. D90 (FIG. 5C) includes a linear concavo-convex pattern of a convex portion with a width of 90 μm and a concave portion with a width of 10 μm. D100 (FIG. 5D) includes no concavo-convex pattern, since the convex portions make up the whole of the small region.

(Polishing Conditions)

Polishing test machine: a single-sided polishing machine LP-541 with a platen diameter of 540 mm manufactured by Lapmaster SFT Corp.

Polishing pad: IC-1000/Suba400 manufactured by NITTA HAAS Incorporated

Number of revolutions of platen: 100 rpm

Number of revolutions of head: 110 rpm (the rotation direction is the same as that of the platen)

Polishing load: 30 kPa (a set value)

Supply of polishing liquid composition: 200 mL/min (0.6 g/(cm²·min))

Using the polishing liquid compositions as shown in Table 5, the evaluation samples were polished under the above polishing conditions. After polishing the objects to be polished, they were cleaned with running ion-exchanged water, and then immersed in ion-exchanged water and ultrasonically cleaned (at 100 kHz for 3 minutes). Further, the objects to be polished were cleaned with running ion-exchanged water, and finally dried by spin drying.

Figure 7:
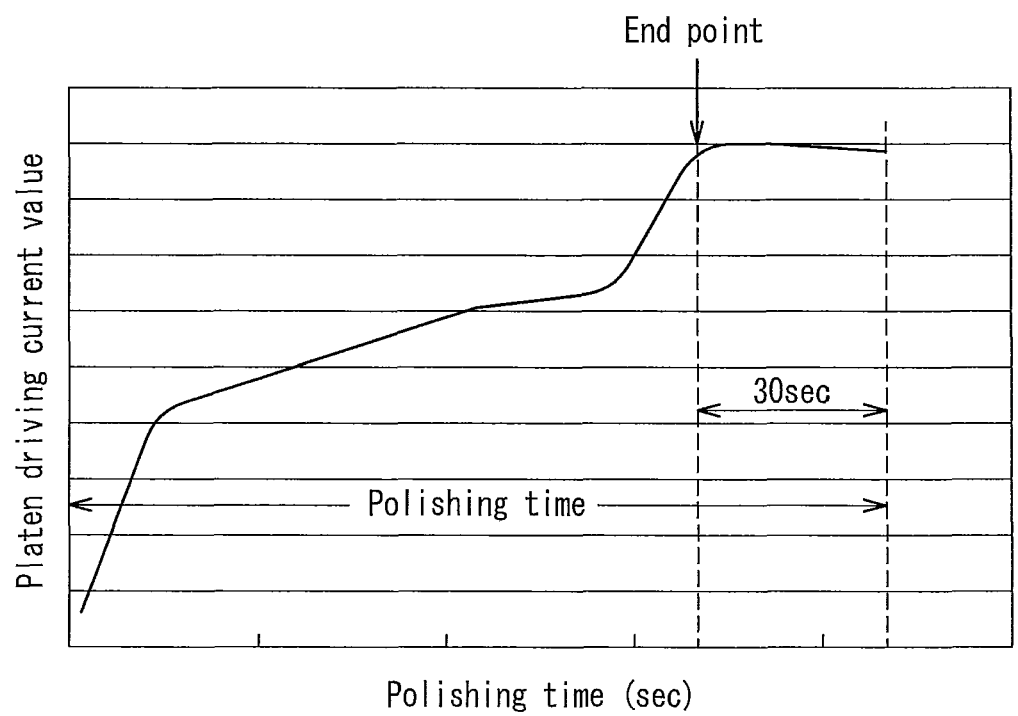
FIG. 7 is a graph showing changes in a platen driving current value over time.

The end of polishing was determined by utilizing torque measurement. In this measurement, the end of polishing is determined by changes in friction coefficient between the surface to be polished and the polishing pad. Actually, the end of polishing was determined by changes in driving current of the platen on which the object to be polished was placed rather than by measuring the friction coefficient. In the early stage of polishing, only the HDP film came into contact with the polishing pad. In the final stage of polishing, however, the $Si_3N_4$ film was exposed, and thus the friction coefficient was changed. Therefore, the driving current value of the platen was also changed. When the $Si_3N_4$ film was exposed, the driving current value became saturated. The time at which the driving current value reached saturation was identified as an end point (EP) of polishing, and the polishing was performed for 30 more seconds and finished (see FIG. 7). Accordingly, the polishing time was expressed by (the time between the start of polishing and the EP+30) seconds. FIG. 7 shows an example of changes in the driving current value of the platen over time. The polishing times were 72 seconds in Example 21, 93 seconds in Example 22, 105 seconds in Example 23, 131 seconds in Example 24, 85 seconds in Example 25, 87 seconds in Example 26, 150 seconds in Comparative Example 15, and 85 seconds in Reference Example 1.

Figure 6:
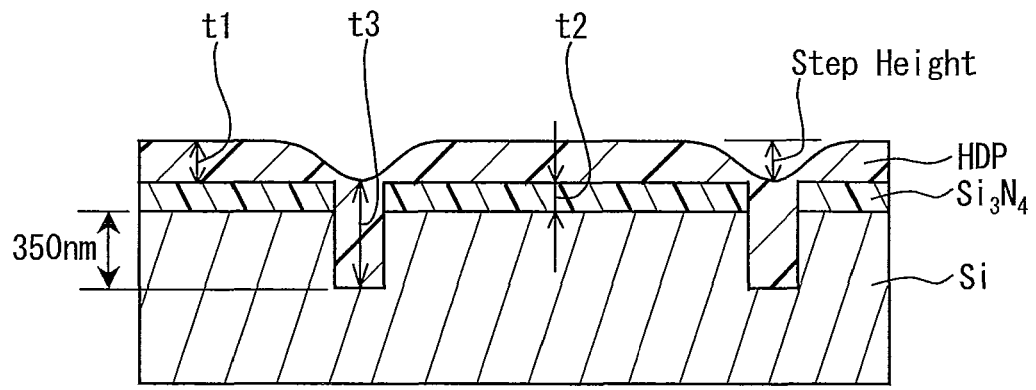
FIG. 6 is a conceptual diagram of a polished evaluation sample.

The remaining thickness of the center of the polished evaluation sample was measured with a spectrometric film thickness measurement system (VM-1000 manufactured by DAINIPPON SCREEN MFG. CO., LTD.). FIG. 6 is a conceptual diagram of the polished evaluation sample. As shown in FIG. 6, three types of remaining thicknesses were measured: the thickness (t1) of the HDP film in the convex portion; the thickness (t2) of the $Si_3N_4$ film in the convex portion; and the thickness (t3) of the HDP film in the concave portion.

From the measurement results, the flatness was evaluated based on the criteria as shown in Table 7. Table 6 shows the evaluation results. The marks (○ and ×) in Table 6 are based on the criteria of Table 7. Moreover, the "step height" in Tables 7 and 6 indicates a difference in thickness between the convex portion and the concave portion after polishing, and can be calculated by the following formula using the thickness (t1) of the HDP film in the convex portion, the thickness (t2) of the $Si_3N_4$ film in the convex portion, and the thickness (t3) of the HDP film in the concave portion (see FIG. 6). All the thicknesses of the following formula are in nanometers (nm).

Step Height={$Si_3N_4$film thickness(convex portion)+ HDP film thickness(convex portion)+350}−HDP film thickness(concave portion)=(t2+t1+350)−t3

In general, the remaining thickness in the convex portion increases as the surface density of the convex portion becomes larger (i.e., the surface density of the concave portion becomes smaller), while the concave portion is ground more easily and a dishing phenomenon is more likely to occur as the surface density of the convex portion becomes smaller (i.e., the surface density of the concave portion becomes larger). Thus, the evaluation of whether or not the polishing was performed sufficiently was based on the measurement results of D90 and D100 (including no concave portion), and the evaluation of the effect of suppressing the dishing phenomenon was based on the measurement results of D20.

TABLE 6

|  |  |  | Ex. 21 | Ex. 22 | Ex. 23 | Ex. 24 | Ex. 25 | Ex. 26 | Comp. Ex. 15 | Ref. Ex. 1 |
|---|---|---|---|---|---|---|---|---|---|---|
| D100 | Convex portion | HDP | 95[×1] | 7 | 0 | 58 | 0 | 42 | 0 | 0 |
|  |  |  | ○ | ○ | ○ | ○ | ○ | ○ | ○ | ○ |
|  |  | $Si_3N_4$ | 149 | 150 | 140 | 150 | 144 | 148 | 150 | 0 |
|  |  |  | ○ | ○ | ○ | ○ | ○ | ○ | ○ | × |
| D90 | Convex portion | HDP | 41 | 0 | 0 | 39 | 0 | 50 | 19 | 0 |
|  |  |  | ○ | ○ | ○ | ○ | ○ | ○ | ○ | ○ |
|  |  | $Si_3N_4$ | 150 | 149 | 139 | 150 | 144 | 148 | 150 | 0 |
|  |  |  | ○ | ○ | ○ | ○ | ○ | ○ | ○ | × |

TABLE 6-continued

|  |  |  | Ex. 21 | Ex. 22 | Ex. 23 | Ex. 24 | Ex. 25 | Ex. 26 | Comp. Ex. 15 | Ref. Ex. 1 |
|---|---|---|---|---|---|---|---|---|---|---|
|  | Concave portion | HDP | 545 ○ | 502 ○ | 481 ○ | 537 ○ | 477 ○ | 552 ○ | 522 ○ | 340 X |
|  | Step Height[X-2] |  | −4 ○ | −3 ○ | 8 ○ | 2 ○ | 17 ○ | −3 ○ | 2 ○ | 10 ○ |
| D50 | Convex portion | HDP | 17 ○ | 0 ○ | 0 ○ | 38 ○ | 0 ○ | 10 ○ | 8 ○ | 0 ○ |
|  |  | $Si_3N_4$ | 150 ○ | 133 ○ | 137 ○ | 150 ○ | 145 ○ | 143 ○ | 150 ○ | 0 X |
|  | Concave portion | HDP | 521 ○ | 500 ○ | 465 ○ | 545 ○ | 486 ○ | 487 ○ | 521 ○ | 249 X |
|  | Step Height |  | −4 ○ | −17 ○ | 22 ○ | −8 ○ | 9 ○ | 17 ○ | −8 ○ | 101 X |
| D20 | Convex portion | HDP | 0 ○ | 0 ○ | 0 ○ | 0 ○ | 0 ○ | 0 ○ | 0 ○ | 0 ○ |
|  |  | $Si_3N_4$ | 131 ○ | 123 ○ | 128 ○ | 124 ○ | 134 ○ | 120 ○ | 128 ○ | 0 X |
|  | Concave portion | HDP | 489 ○ | 483 ○ | 470 ○ | 501 ○ | 475 ○ | 436 ○ | 492 ○ | 77 X |
|  | Step Height |  | −7 ○ | −10 ○ | 8 ○ | −3 ○ | 9 ○ | 34 ○ | −14 ○ | 273 X |
| Polishing time (sec) |  |  | 72 | 93 | 105 | 131 | 85 | 87 | 150 | 85 |

[X-1] All the numerical values of D100, D90, D50, and D20 are in nanometers (nm).
[X-2] The step height is determined by calculation of HDP film thickness (convex) + SiN film thickness (convex) + 350 − HDP film thickness (concave)

TABLE 7

|  | ○ | X |
|---|---|---|
| Convex portion | HDP | less than 100 nm | 100 nm or more |
|  | $Si_3N_4$ | 120 nm or more | less than 120 nm |
| Concave portion | HDP | 400 nm or more | less than 400 nm |
| Step Height |  | less than 50 nm | 50 nm or more |

As shown in Table 6, in each of the evaluation samples polished with the polishing liquid compositions of Examples 21 to 26, the thickness (t1) of the HDP film in the convex portion, the thickness (t2) of the $Si_3N_4$ film in the convex portion, the thickness (t3) of the HDP film in the concave portion, and the step height in all the regions met the criteria represented by ○ in Table 7. Therefore, it was confirmed that the polishing liquid compositions of Examples 21 to 26 were capable of suppressing the occurrence of dishing, achieving sufficient polishing, and providing a polished surface with high flatness. Moreover, the polishing time was shorter with the use of the polishing liquid compositions of Examples 21 to 26 than with the use of that of Comparative Example 15.

In the evaluation sample polished with the polishing liquid composition of Comparative Example 15, the thickness (t1) of the HDP film in the convex portion, the thickness (t2) of the $Si_3N_4$ film in the convex portion, the thickness (t3) of the HDP film in the concave portion, and the step height in all the regions met the criteria represented by ○ in Table 7. However, the polishing time was longer with the use of the polishing liquid composition of Comparative Example 15 than with the use of those of Example 21 and Reference Example 1.

When the polishing liquid composition of Reference Example 1 was used, although the polishing time was shorter than in the case of the polishing liquid compositions of Examples 22, 23, 24, and 26, dishing occurred in most regions due to excessive polishing, so that the flatness of the polished surface had a problem.

The above evaluation results confirmed that when an uneven surface was polished with the polishing liquid composition including specific composite oxide particles containing cerium and zirconium, the dispersing agent, the water-soluble organic compound, and the aqueous medium, a polished surface with excellent flatness could be formed in a short time.

Example 27

A polishing liquid composition was prepared to have the composition as shown in Table 8 in the following manner. First, a 30 wt % aqueous solution of ammonium polyacrylate (degree of neutralization: 65 mol %, weight average molecular weight: 6000) was mixed with ion-exchanged water. Then, the $Ce_{0.87}Zr_{0.13}O_2$ particle slurry was added to the resultant mixed solution while stirring the mixed solution. Moreover, the pH of this mixed solution was adjusted to 6.2 with a 10% ammonia aqueous solution. Thus, the polishing liquid composition was prepared.

Examples 28 to 30

Polishing liquid compositions were prepared to have the compositions as shown in Table 8 in the same manner as Example 27 except that the $Ce_{0.80}Zr_{0.20}O_2$ particle slurry, the $Ce_{0.75}Zr_{0.25}O_2$ particle slurry, or the $Ce_{0.62}Zr_{0.38}O_2$ particle slurry was used instead of the $Ce_{0.87}Zr_{0.13}O_2$ particle slurry.

Example 31

A polishing liquid composition was prepared to have the composition as shown in Table 8 in the following manner. First, a 40 wt % aqueous solution of ammonium polyacrylate (degree of neutralization: 20 mol %, weight average molecular weight: 2000) was mixed with ion-exchanged water. Then, the $Ce_{0.75}Zr_{0.25}O_2$ particle slurry was added to the resultant mixed solution while stirring the mixed solution. Moreover, the pH of this mixed solution was adjusted to 5.0 with a 10% ammonia aqueous solution. Thus, the polishing liquid composition was prepared.

Example 32

A polishing liquid composition was prepared to have the composition as shown in Table 8 in the following manner. First, a 43 wt % aqueous solution of a sodium salt of a copolymer of acrylic acid and AMPS (2-acrylamide-2-methylpropanesulfonic acid) (ARON A-6017 with a weight average molecular weight of 6000 manufactured by TOAGOSEI CO., LTD.) was mixed with ion-exchanged water. Then, the $Ce_{0.87}Zr_{0.13}O_2$ particle slurry was added to the resultant mixed solution while stirring the mixed solution. Moreover, the pH of this mixed solution was adjusted to 6.5 with 1% nitric acid. Thus, the polishing liquid composition was prepared.

Example 33

A polishing liquid composition was prepared to have the composition as shown in Table 8 in the following manner. First, an ammonium salt of a copolymer of acrylic acid and maleic acid (degree of neutralization: 90 mol %, weight average molecular weight: 6000) was mixed with ion-exchanged water. Then, the $Ce_{0.75}Zr_{0.25}O_2$ particle slurry was added to the resultant mixed solution while stirring the mixed solution. Moreover, the pH of this mixed solution was adjusted to 6.0 with 1% nitric acid. Thus, the polishing liquid composition was prepared.

Comparative Example 16

A polishing liquid composition having the composition as shown in Table 8 was prepared in the same manner as Example 27 except that the $CeO_2$ particle slurry was used instead of the $Ce_{0.87}Zr_{0.13}O_2$ particle slurry.

Reference Example 2

A polishing liquid composition having the composition as shown in Table 8 was prepared in the same manner as Example 27. The $Ce_{0.75}Zr_{0.25}O_2$ particle slurry was added to ion-exchanged water while stirring the ion-exchanged water. Moreover, the pH of this mixed solution was adjusted to 6.2 with 1% nitric acid. Thus, the polishing liquid composition was prepared.

Comparative Example 17

A polishing liquid composition having the composition as shown in Table 8 was prepared in the same manner as Example 31 except that the $CeO_2$ particle slurry was used instead of the $Ce_{0.75}Zr_{0.25}O_2$ particle slurry, and the content of the water-soluble acrylic acid-based polymer was changed.

Comparative Example 18

A polishing liquid composition having the composition as shown in Table 8 was prepared in the same manner as Example 32 except that the $CeO_2$ particle slurry was used instead of the $Ce_{0.87}Zr_{0.13}O_2$ particle slurry, and the contents of the composite oxide particles and the water-soluble acrylic acid-based polymer were changed.

TABLE 8

| | Ex. 27 (wt %) | Ex. 28 (wt %) | Ex. 29 (wt %) | Ex. 30 (wt %) | Ex. 31 (wt %) | Ex. 32 (wt %) | Ex. 33 (wt %) | Comp. Ex. 16 (wt %) | Ref. Ex. 2 (wt %) | Comp. Ex. 17 (wt %) | Comp. Ex. 18 (wt %) |
|---|---|---|---|---|---|---|---|---|---|---|---|
| $Ce_{0.87}Zr_{0.13}O_2$ particles | 1.0 | — | — | — | — | 1.0 | — | — | — | — | — |
| $Ce_{0.80}Zr_{0.20}O_2$ particles | — | 1.0 | — | — | — | — | — | — | — | — | — |
| $Ce_{0.75}Zr_{0.25}O_2$ particles | — | — | 1.0 | — | 1.5 | — | 1.0 | — | 1.0 | — | — |
| $Ce_{0.62}Zr_{0.38}O_2$ particles | — | — | — | 1.0 | — | — | — | — | — | — | — |
| $CeO_2$ particles | — | — | — | — | — | — | — | 1.0 | — | 1.5 | 1.0 |
| Ammonium polyacrylate (Mw 6000) | 0.80 | 0.70 | 0.70 | 0.70 | — | — | — | 0.55 | — | — | — |
| Ammonium polyacrylate (Mw 2000) | — | — | — | — | 0.21 | — | — | — | — | 0.20 | — |
| Acrylic acid-AMPS copolymer | — | — | — | — | — | 1.3 | — | — | — | — | 1.1 |
| Acrylic acid-maleic acid copolymer | — | — | — | — | — | — | 0.6 | — | — | — | — |
| Dispersing agent[X1] | 0.0025 | 0.0025 | 0.0025 | 0.0025 | 0.0025 | 0.0025 | 0.0025 | 0.0025 | 0.0025 | 0.0025 | 0.0025 |
| Ion-exchanged water and pH adjuster | Residual | Residual | Residual | Residual | Residual | Residual | Residual | Residual | Residual | Residual | Residual |
| Total | 100.0 | 100.0 | 100.0 | 100.0 | 100.0 | 100.0 | 100.0 | 100.0 | 100.0 | 100.0 | 100.0 |

[X1] Ammonium polyacrylate added during the preparation of composite oxide particle slurry (Evaluation Sample)

As an evaluation sample, a commercially available wafer for evaluating the CMP characteristics (STI MIT 864 with a diameter of 200 mm), which had been used for the evaluations of Examples 21 to 26, Comparative Example 15, and Reference Example 1, was prepared.

(Polishing Conditions)

The polishing conditions were the same as those for the evaluations of Examples 21 to 26, Comparative Example 15, and Reference Example 1. The end of polishing was determined by utilizing the torque measurement.

The polished evaluation sample was cleaned and dried in the same manner as that for the evaluations of Examples 21 to 26, Comparative Example 15, and Reference Example 1.

The polishing times were 78 seconds in Example 27, 76 seconds in Example 28, 82 seconds in Example 29, 90 seconds in Example 30, 72 seconds in Example 31, 93 seconds in Example 32, 99 seconds in Example 33, 102 seconds in Comparative Example 16, 85 seconds in Reference Example 2, 105 seconds in Comparative Example 17, and 128 seconds in Comparative Example 18.

The remaining thickness of the center of the polished evaluation sample was measured with a spectrometric film thickness measurement system (VM-1000 manufactured by DAINIPPON SCREEN MFG. CO., LTD.). FIG. 6 is a conceptual diagram of the polished evaluation sample. As shown in FIG. 6, three types of remaining thicknesses were measured: the thickness (t1) of the HDP film in the convex portion; the thickness (t2) of the $Si_3N_4$ film in the convex portion; and the thickness (t3) of the HDP film in the concave portion.

From the measurement results, the flatness was evaluated based on the criteria as shown in Table 7. Table 9 shows the evaluation results. The marks (○ and ×) in Table 9 are based on the criteria of Table 7.

the use of the polishing liquid compositions of Examples 27 to 33 than with the use of those of Comparative Examples 16, 17, and 18.

In the evaluation sample polished with the polishing liquid composition of Comparative Example 16, except for the thickness (t2) of the $Si_3N_4$ film in the convex portion in D20, the thickness (t1) of the HDP film in the convex portion, the thickness (t2) of the $Si_3N_4$ film in the convex portion, the thickness (t3) of the HDP film in the concave portion, and the step height in all other regions met the criteria represented by ○ in Table 7. In each of the evaluation samples polished with the polishing liquid compositions of Comparative Examples 17 and 18, the thickness (t1) of the HDP film in the convex portion, the thickness (t2) of the $Si_3N_4$ film in the convex portion, the thickness (t3) of the HDP film in the concave portion, and the step height in all the regions met the criteria represented by ○ in Table 7. However, the polishing time was longer with the use of the polishing liquid compositions of Comparative Examples 16, 17, and 18 than with the use of those of Examples 27 to 33 and Reference Example 2.

When the polishing liquid composition of Reference Example 2 was used, although the polishing time was shorter

TABLE 9

| | | | Ex. 27 | Ex. 28 | Ex. 29 | Ex. 30 | Ex. 31 | Ex. 32 | Ex. 33 | Comp. Ex. 16 | Ref. Ex. 2 | Comp. Ex. 17 | Comp. Ex. 18 |
|---|---|---|---|---|---|---|---|---|---|---|---|---|---|
| D100 | Convex portion | HDP | 0[X.1] | 0 | 0 | 95 | 0 | 0 | 50 | 0 | 0 | 0 | 92 |
| | | | ○ | ○ | ○ | ○ | ○ | ○ | ○ | ○ | ○ | ○ | ○ |
| | | $Si_3N_4$ | 150 | 144 | 148 | 149 | 145 | 143 | 149 | 146 | 0 | 150 | 147 |
| | | | ○ | ○ | ○ | ○ | ○ | ○ | ○ | ○ | × | ○ | ○ |
| D90 | Convex portion | HDP | 0 | 0 | 14 | 77 | 0 | 0 | 86 | 0 | 0 | 0 | 19 |
| | | | ○ | ○ | ○ | ○ | ○ | ○ | ○ | ○ | ○ | ○ | ○ |
| | | $Si_3N_4$ | 149 | 142 | 150 | 150 | 146 | 141 | 149 | 145 | 0 | 150 | 148 |
| | | | ○ | ○ | ○ | ○ | ○ | ○ | ○ | ○ | × | ○ | ○ |
| | Concave portion | HDP | 484 | 488 | 503 | 570 | 481 | 496 | 571 | 485 | 340 | 493 | 528 |
| | | | ○ | ○ | ○ | ○ | ○ | ○ | ○ | ○ | × | ○ | ○ |
| | Step Height[X.2] | | 15 | 4 | 11 | 7 | 15 | −4 | 14 | 10 | 10 | 7 | 2 |
| | | | ○ | ○ | ○ | ○ | ○ | ○ | ○ | ○ | ○ | ○ | ○ |
| D50 | Convex portion | HDP | 0 | 0 | 0 | 0 | 0 | 0 | 10 | 0 | 0 | 20 | 9 |
| | | | ○ | ○ | ○ | ○ | ○ | ○ | ○ | ○ | ○ | ○ | ○ |
| | | $Si_3N_4$ | 149 | 140 | 147 | 141 | 143 | 140 | 149 | 141 | 0 | 150 | 147 |
| | | | ○ | ○ | ○ | ○ | ○ | ○ | ○ | ○ | × | ○ | ○ |
| | Concave portion | HDP | 480 | 486 | 491 | 486 | 483 | 487 | 507 | 479 | 249 | 509 | 517 |
| | | | ○ | ○ | ○ | ○ | ○ | ○ | ○ | ○ | × | ○ | ○ |
| | Step Height | | 19 | 4 | 4 | 5 | 10 | 3 | 2 | 12 | 101 | 11 | −11 |
| | | | ○ | ○ | ○ | ○ | ○ | ○ | ○ | ○ | × | ○ | ○ |
| D20 | Convex portion | HDP | 0 | 0 | 0 | 51 | 0 | 0 | 0 | 0 | 0 | 0 | 0 |
| | | | ○ | ○ | ○ | ○ | ○ | ○ | ○ | ○ | ○ | ○ | ○ |
| | | $Si_3N_4$ | 138 | 121 | 136 | 149 | 133 | 123 | 127 | 114 | 0 | 138 | 132 |
| | | | ○ | ○ | ○ | ○ | ○ | ○ | ○ | × | × | ○ | ○ |
| | Concave portion | HDP | 447 | 445 | 469 | 558 | 470 | 428 | 448 | 415 | 77 | 466 | 467 |
| | | | ○ | ○ | ○ | ○ | ○ | ○ | ○ | ○ | × | ○ | ○ |
| | Step Height | | 41 | 26 | 17 | −7 | 13 | 45 | 30 | 49 | 273 | 22 | 15 |
| | | | ○ | ○ | ○ | ○ | ○ | ○ | ○ | ○ | × | ○ | ○ |
| Polishing time (sec) | | | 78 | 76 | 82 | 90 | 72 | 93 | 99 | 102 | 85 | 105 | 128 |

[X.1] All the numerical values of D100, D90, D50, and D20 are in nanometers (nm).
[X.2] The step height is determined by calculation of HDP film thickness (convex) + SiN film thickness (convex) + 350 − HDP film thickness (concave)

As shown in Table 9, in each of the evaluation samples polished with the polishing liquid compositions of Examples 27 to 33, the thickness (t1) of the HDP film in the convex portion, the thickness (t2) of the $Si_3N_4$ film in the convex portion, the thickness (t3) of the HDP film in the concave portion, and the step height in all the regions met the criteria represented by ○ in Table 7. Therefore, it was confirmed that the polishing liquid compositions of Examples 27 to 33 were capable of suppressing the occurrence of dishing, achieving sufficient polishing, and providing a polished surface with high flatness. Moreover, the polishing time was shorter with than in the case of the polishing liquid compositions of Examples 30, 32, and 33, dishing occurred in most regions due to excessive polishing, as shown in Table 8, so that the flatness of the polished surface had a problem.

The above evaluation results confirmed that when an uneven surface was polished with the polishing liquid composition including specific composite oxide particles containing cerium and zirconium, the dispersing agent, the water-soluble acrylic acid-based polymer, and the aqueous medium, a polished surface with excellent flatness could be formed in a short time.

INDUSTRIAL APPLICABILITY

The use of an example of the polishing liquid composition of this embodiment can polish the object to be polished at a higher speed and reduce scratches. Therefore, the polishing liquid composition of this embodiment is suitable for the polishing of an oxide film (e.g., a silicon oxide film) constituting a semiconductor device, the base material of a chemically tempered glass substrate such as an aluminosilicate glass substrate, the base material of a crystallized glass substrate such as a glass-ceramic substrate, the base material of a synthetic quartz glass substrate used as a photomask substrate or a lens material for stepper, or a glass surface or the like of a liquid crystal display panel.

The use of an example of the polishing liquid composition of the present invention can provide a polished surface with excellent flatness in a short time. Therefore, the polishing liquid composition of the present invention is useful as a polishing liquid composition used in the manufacturing process of various semiconductor devices, particularly useful for the manufacture of IC and LSI.

The invention claimed is:

1. A polishing liquid composition comprising:
composite oxide particles containing cerium and zirconium;
a dispersing agent; and
an aqueous medium,
wherein a powder X-ray diffraction spectrum of the composite oxide particles obtained by CuKα1 ray, where λ=0.154050 nm, irradiation includes
a first peak having a peak top in a diffraction angle 2θ range of 28.61 to 29.67°, wherein θ is a Bragg angle,
a second peak having a peak top in a diffraction angle 2θ range of 33.14 to 34.53°,
a third peak having a peak top in a diffraction angle 2θ range of 47.57 to 49.63°, and
a fourth peak having a peak top in a diffraction angle 2θ range of 56.45 to 58.91°,
wherein a half-width of the first peak is 0.8° or less, and
wherein when there is at least one peak of a peak $a_1$ derived from a cerium oxide and a peak $a_2$ derived from a zirconium oxide in the powder X-ray diffraction spectrum, both heights of peak tops of the peaks $a_1$, $a_2$ are 0% of a height of the peak top of the first peak, where the peak top of the peak $a_1$ lies in a diffraction angle 2θ range of 28.40 to 28.59° and the peak top of the peak $a_2$ lies in a diffraction angle 2θ range of 29.69 to 31.60°.

2. The polishing liquid composition according to claim 1, wherein an area of the second peak is 10 to 50% of an area of the first peak, an area of the third peak is 35 to 75% of the area of the first peak, and an area of the fourth peak is 20 to 65% of the area of the first peak.

3. The polishing liquid composition according to claim 1 or 2, wherein a volume median diameter of the composite oxide particles is 30 to 1000 nm.

4. The polishing liquid composition according to claim 1, further comprising a water-soluble organic compound.

5. The polishing liquid composition according to claim 4, wherein the water-soluble organic compound includes an amphoteric water-soluble organic compound having a molecular weight of 1,000 or less.

6. The polishing liquid composition according to claim 4, wherein the water-soluble organic compound includes a water-soluble acrylic acid-based polymer.

7. The polishing liquid composition according to claim 6, wherein the water-soluble acrylic acid-based polymer is polyacrylic acid having a constitutional unit derived from at least one monomer selected from the group consisting of acrylic acid and a non-metallic salt of acrylic acid.

8. The polishing liquid composition according to any one of claims 4 to 7, wherein 0.1 to 8 wt % of the composite oxide particles, 0.0005 to 0.5 wt % of the dispersing agent, and 0.02 to 15 wt % of the water-soluble organic compound are included in the total amount of the polishing liquid composition.

9. The polishing liquid composition according to any one of claims 4 to 7, wherein 1 to 20 wt % of the composite oxide particles, 0.001 to 1.0 wt % of the dispersing agent, and 0.08 to 40 wt % of the water-soluble organic compound are included in the total amount of the polishing liquid composition.

10. The polishing liquid composition according to any one of claims 4 to 7, wherein the aqueous medium includes a first aqueous medium and a second aqueous medium, and
the polishing liquid composition is a two-liquid type that comprises an aqueous medium composition (I) including the composite oxide particles, the dispersing agent, and the first aqueous medium and an aqueous medium composition (II) including the water-soluble organic compound and the second aqueous medium;
wherein the aqueous medium composition (I) does not include the water-soluble organic compound and the aqueous medium composition (II) does not include the composite oxide particles.

11. An additive aqueous solution comprising the water-soluble organic compound and the second aqueous medium and being used with the aqueous medium composition (I) that constitutes the polishing liquid composition according to claim 10.

* * * * *